(12) United States Patent
Cho et al.

(10) Patent No.: US 11,889,217 B2
(45) Date of Patent: Jan. 30, 2024

(54) IMAGE SENSOR INCLUDING AUTO-FOCUS PIXELS

(71) Applicant: SAMSUNG ELECTRONICS CO., LTD., Suwon-si (KR)

(72) Inventors: Jeongjin Cho, Yongin-si (KR); Youjin Jeong, Seoul (KR); Taesub Jung, Hwaseong-si (KR)

(73) Assignee: SAMSUNG ELECTRONICS CO., LTD.

( * ) Notice: Subject to any disclaimer, the term of this patent is extended or adjusted under 35 U.S.C. 154(b) by 0 days.

(21) Appl. No.: 17/714,687

(22) Filed: Apr. 6, 2022

(65) Prior Publication Data

US 2022/0329747 A1    Oct. 13, 2022

(30) Foreign Application Priority Data

Apr. 8, 2021 (KR) .................. 10-2021-0046100

(51) Int. Cl.
*H04N 25/77* (2023.01)
*G02B 3/00* (2006.01)
*H01L 27/146* (2006.01)
*G02B 5/20* (2006.01)
*H04N 25/11* (2023.01)

(52) U.S. Cl.
CPC .......... *H04N 25/77* (2023.01); *G02B 3/0043* (2013.01); *G02B 3/0056* (2013.01); *G02B 5/201* (2013.01); *H01L 27/14607* (2013.01); *H01L 27/14621* (2013.01); *H01L 27/14627* (2013.01); *H01L 27/14645* (2013.01); *H04N 25/11* (2023.01)

(58) Field of Classification Search
CPC ........ H04N 25/77; H04N 25/11; H04N 25/13; H04N 25/133; H04N 25/585; H04N 25/704; H04N 25/766; G02B 3/0043; G02B 3/0056; G02B 5/201; H01L 27/14607; H01L 27/14621; H01L 27/14627; H01L 27/14645; H01L 27/1461
See application file for complete search history.

(56) References Cited

U.S. PATENT DOCUMENTS

| 9,888,198 B2 | 2/2018 | Mauritzson et al. |
| 9,893,109 B2 | 2/2018 | Kimura |
| 10,014,338 B2 | 7/2018 | Lee |
| 10,015,426 B2 | 7/2018 | Ishiwata |
| 2017/0366770 A1* | 12/2017 | Yokogawa ........... H04N 25/704 |

(Continued)

FOREIGN PATENT DOCUMENTS

KR    1020200090763 A    7/2020

*Primary Examiner* — Gevell V Selby
(74) *Attorney, Agent, or Firm* — Fish & Richardson P.C.

(57) ABSTRACT

An image sensor includes; a pixel array including pixels arranged in a first direction and a second direction, wherein the pixels includes a first normal pixel and a first auto focus (AF) pixel adjacent in the first direction, and a second AF pixel and a second normal pixel adjacent in the first direction. Each of the first AF pixel and the second AF pixel includes at least two photodiodes, each of the first normal pixel and the second normal pixel has a quadrangular shape, a first length of the first AF pixel in the first direction is greater than a first length of the first normal pixel in the first direction, and a first length of the second AF pixel in the first direction is greater than a first length of the second normal pixel in the first direction.

15 Claims, 24 Drawing Sheets

(56) References Cited

U.S. PATENT DOCUMENTS

| | | |
|---|---|---|
| 2018/0301484 A1 | 10/2018 | Vaartstra et al. |
| 2019/0281240 A1* | 9/2019 | Jung .................. H04N 25/704 |
| 2020/0358989 A1 | 11/2020 | Hoshino |
| 2021/0400216 A1* | 12/2021 | Lee ..................... H04N 25/79 |
| 2022/0293659 A1* | 9/2022 | Cho ..................... H04N 25/62 |

* cited by examiner

IMAGE SENSOR INCLUDING AUTO-FOCUS PIXELS

CROSS-REFERENCE TO RELATED APPLICATION

This application claims priority under 35 U.S.C. § 119 to Korean Patent Application No. 10-2021-0046100 filed on Apr. 8, 2021 in the Korean Intellectual Property Office, the subject matter of which is hereby incorporated by reference in its entirety.

BACKGROUND

The inventive concept relates to image sensors, and more particularly, to image sensors including auto-focus (AF) pixels.

An image sensor, which captures an image and converts the image into an electric signal, is used not only in electronic devices for common use such as digital cameras, mobile phone cameras, and mobile camcorders, but also in cameras installed in vehicles, security devices, and robots. Image sensor include a pixel array, wherein each pixel may include at least one photodiode. However, image sensors capable of performing an auto-focus (AF) function that quickly and accurately captures an image are required.

SUMMARY

Embodiments of the inventive concept provide an image sensor capable of simultaneously optimizing the performances of normal pixels and auto-focus (AF) pixels.

According to an aspect of the inventive concept, there is provided an image sensor including; a pixel array including pixels arranged in a first direction and a second direction, wherein the pixels includes a first normal pixel and a first auto focus (AF) pixel adjacent in the first direction, and a second AF pixel and a second normal pixel adjacent in the first direction, wherein each of the first AF pixel and the second AF pixel includes at least two photodiodes, each of the first normal pixel and the second normal pixel has a quadrangular shape, a first length of the first AF pixel in the first direction is greater than a first length of the first normal pixel in the first direction, and a first length of the second AF pixel in the first direction is greater than a first length of the second normal pixel in the first direction.

According to another aspect of the inventive concept, there is provided an image sensor including; a pixel array including a first normal pixel group, a second normal pixel group, a first AF pixel group, and a second AF pixel group, wherein each of the first normal pixel group and the second normal pixel group includes at least one normal pixel having a same color filter, each of the first AF pixel group and the second AF pixel group includes AF pixels having a same color filter, the first normal pixel group and the first AF pixel group are adjacent in a first direction, the second AF pixel group and the second normal pixel group are adjacent in the first direction, each of the AF pixels includes at least two photodiodes, a first length of the first AF pixel group in the first direction is greater than a first length of the first normal pixel group in the first direction, and a first length of the second AF pixel group in the first direction is greater than a first length of the second normal pixel group in the first direction.

According to another aspect of the inventive concept, there is provided an image sensor including; a pixel array including pixels arranged in a first direction and a second direction, wherein the pixels include a first normal pixel, a second normal pixel, a first AF pixel and a second AF pixel, wherein each of the first normal pixel and the second normal pixel includes a single photodiode and a microlens, each of the first AF pixel and the second AF pixel includes at least two photodiodes and a microlens, the first normal pixel and the first AF pixel are adjacent in the first direction, the second AF pixel and the second normal pixel are adjacent in the first direction, the first normal pixel and the second AF pixels are adjacent in the second direction, a size of the first AF pixel is greater than a size of the first normal pixel, and a size of the second AF pixel is greater than a size of the second normal pixel.

BRIEF DESCRIPTION OF THE DRAWINGS

The making and use of the inventive concept may be more clearly understood upon consideration of following detailed description together with the accompanying drawings, in which.

DETAILED DESCRIPTION

Throughout the written description and drawings, like reference number and labels are used to denote like or similar elements, components and/or features.

Figure 1:
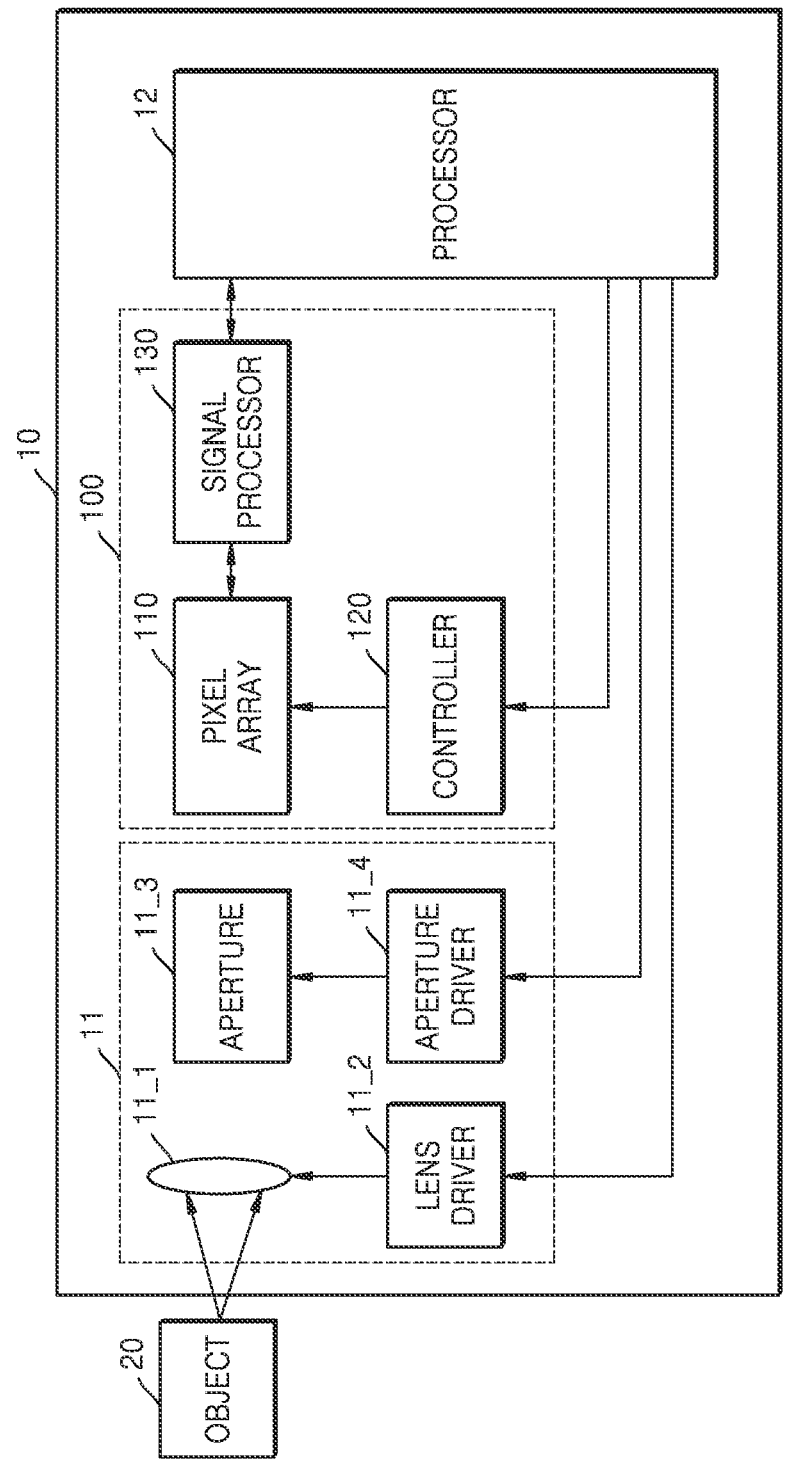
FIG. 1 is a block diagram illustrating a digital imaging device according to embodiments of the inventive concept.

FIG. 1 is a block diagram illustrating a digital imaging device 10 capable of performing an auto-focus (AF) function according to embodiments of the inventive concept.

The digital imaging device 10 may generally include an imaging unit 11, an image sensor 100 and a processor 12.

The operation of the digital imaging device 10 may be controlled by the processor 12. For example, the processor 12 may provide respective control signals controlling the operation of a lens driver 11_2, an aperture driver 11_4 and a controller 120.

The imaging unit 11 receives (or captures) incident electromagnetic energy (e.g., visible light) and may include a lens 11_1, a lens driver 11_2, an aperture 11_3, and an aperture driver 11_4. Here, the lens 11_1 may include multiple lenses.

The lens driver 11_2 may exchange information regarding focus detection with the processor 12, and may adjust a position of the lens 11_1 according to the control signal provided by the processor 12. The lens driver 11_2 may shift the lens 11_1 to vary a distance from an object 20. Thus, the distance between the lens 11_1 and the object 20 may be adjusted, such that the resulting position of the lens 11_1 in relation to the object 20 focuses the received incident light.

For example, when the distance between the lens 11_1 and the object 20 is relatively close, the lens 11_1 may vary from an in-focus position. Accordingly, the focus on the object 20 may be adjusted in relation to a detected phase difference occurring between images captured by the image sensor 100. Thus, under the stated working assumption, the lens driver 11_2 may shift the lens 11_1 to increase the distance to the object 20 in response to the control signal provided by the processor 12. In analogous manner, when the distance between the lens 11_1 and the object 20 is relatively far, the lens 11_1 may also vary from the in-focus position, and a corresponding phase difference may be occur between images captured by the image sensor 100. Accordingly, the lens driver 11_2 may shift the lens 11_1 to decrease the distance to the object 20 in response to the control signal provided by the processor 12.

The image sensor 100 may convert incident light into to a corresponding image signal. In some embodiments, the image sensor 100 may include a pixel array 110, the controller 120, and a signal processor 130. Here, the incident light communicated through the lens 11_1 and the aperture 11_3 may form an image of the object 20 at light receiving surface(s) of the pixel array 110.

The pixel array 110 may include a complementary metal oxide semiconductor (CMOS) image sensor (CIS) capable of converting the incident light (or optical signal) into the corresponding electrical signal. Sensitivity of the pixel array 110 may be adjusted by the controller 120. In some embodiments, the pixel array 110 may include a plurality of pixels (hereafter, "pixels") capable of converting the optical signal into the corresponding electrical signal. That is, each pixel may generate a pixel signal according to the intensity of received incident light.

The image sensor 100 may provide image information to the processor 12, and the processor 12 may perform a phase difference calculation based on the image information. For example, the processor 12 may perform the phase difference calculation by receiving, from the signal processor 130, image information according to a pixel signal generated in an AF pixel. Then, phase difference calculation results may be obtained by performing a correlation operation on the image information. In this manner, the processor 12 may obtain an in-focus position, a focus direction, and/or a distance between the object 20 and the image sensor 100 using the phase difference calculation results. Based on the phase difference calculation results, the processor 12 may provide (or output) the control signal to the lens driver 11_2 to shift the position of the lens 11_1.

The processor 12 may reduce noise in an input signal and perform image signal processing to improve image quality (e.g., gamma correction, color filter array interpolation, color matrix correction, color correction, color enhancement, etc.). In addition, the processor 12 may generate an image file by compressing the image data generated by performing the image signal processing. Alternately or additionally, the processor 12 may restore the image data from the image file in an associated memory (not shown in FIG. 1).

Figure 2:
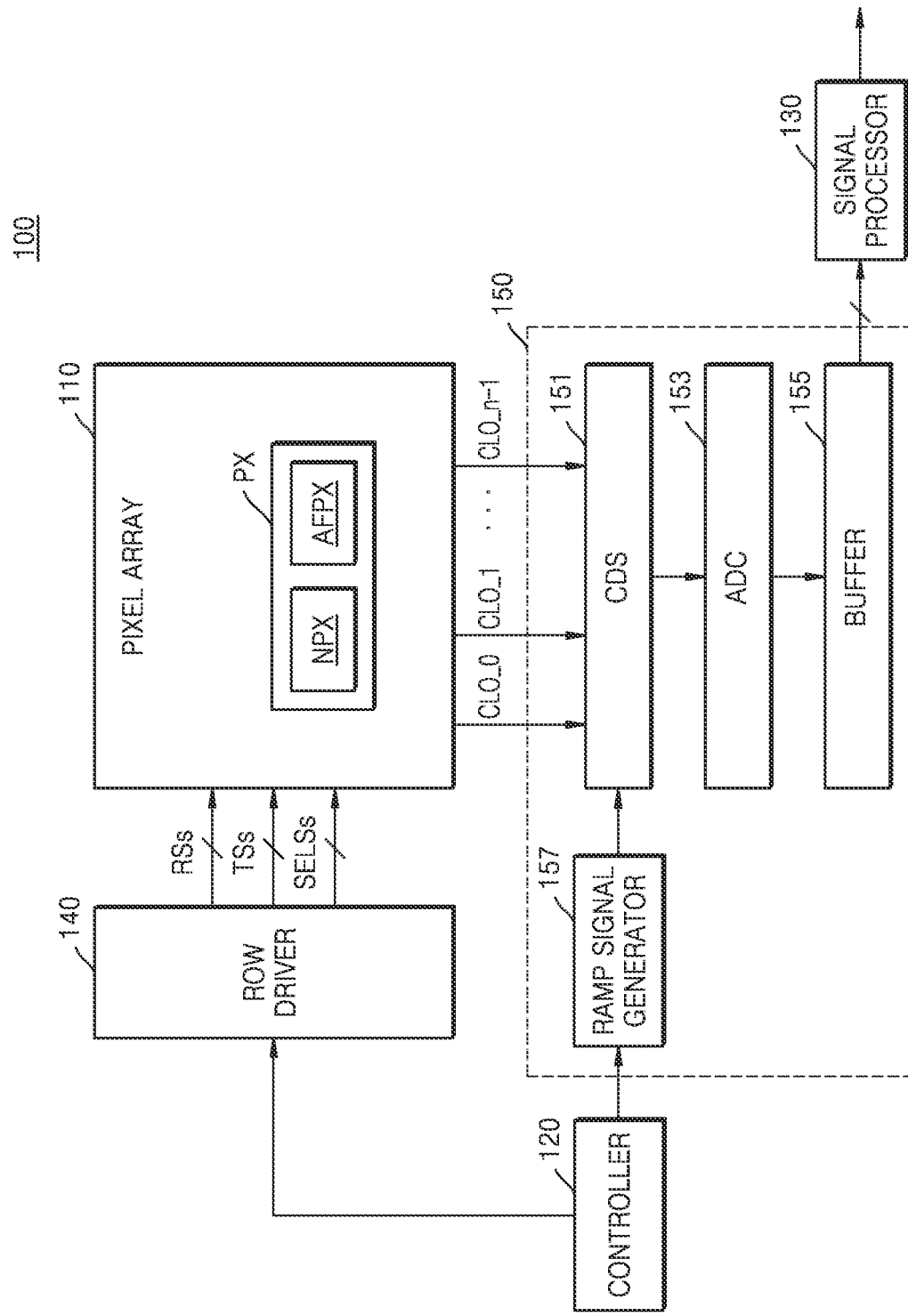
FIG. 2 is a block diagram further illustrating in one example the image sensor 100 of FIG. 1.

FIG. 2 is a block diagram further illustrating in one example the image sensor 100 of FIG. 1.

Referring to FIGS. 1 and 2, the image sensor 100 may include the pixel array 110, the controller 120 and the signal processor 130, as well as a row driver 140 and a signal read-out circuit 150. In some embodiments, the signal read-out circuit 150 may include a correlated-double sampler (CDS) 151, an analog-digital converter (ADC) 153 and a buffer 155.

The pixel array 110 may include pixels PXs that convert an optical signal into an electrical signal. That is, the pixels PXs may respectively generate pixel signals according to the intensity of received incident light. The pixels PXs may include one or more normal pixels NPX configured to perform imaging function(s), and one or more AF pixels AFPXs configured to perform an AF function. In this regard, the AF pixels may also be used to perform other functions, such as a distance measurement function, and when not performing the AF function, the AF pixels AFPXs may be used to generate a pixel signal for imaging like the normal pixels NPXs.

Figure 3:
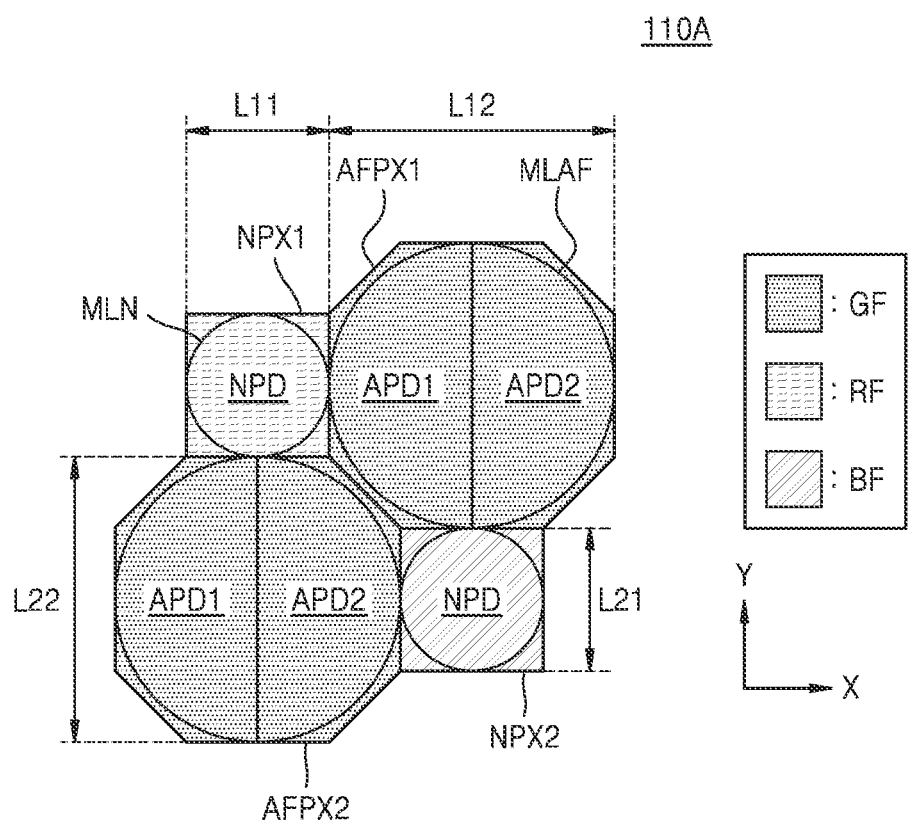
FIGS. 3, 4A, 4B, 4C, 4D, 5, 6, 7, 8, 9A, 9B, 9C, 9D, 10, 11A, 11B, 12A, 12B and 13 are respective diagrams variously illustrating pixel arrays that may be incorporated in image sensors according to embodiments of the inventive concept.

Each of the AF pixels AFPXs may include a first photodiode and a second photodiode adjacent to each other in a first direction (e.g., an X direction, as illustrated in FIG. 3) or a second direction (e.g., a Y direction, as illustrated in FIG. 3), and may further include a microlens disposed in relation to the first photodiode and the second photodiode.

In some embodiments, an area occupied by the AF pixel AFPX may be greater than an area occupied by the normal pixel NPX. For example, a first length of the AF pixel AFPX in the first direction may be greater than a first length of the normal pixel NPX in the first direction, and a second length of the AF pixel AFPX in the second direction may be greater than a second length of the normal pixel NPX in the second direction. Accordingly, with respect to the manufacture of the pixel array 110 of the image sensor 100, the normal pixel NPX and the AF pixel AFPX may be formed with different sizes. Accordingly, the AF pixel AFPX including multiple photodiodes may be readily manufactured, and the performances of the normal pixel NPX and the AF pixel AFPX may be simultaneously optimized.

The normal pixels NPXs and the AF pixels AFPXs may respectively output signals to the CDS 151 through a first column output line CLO_0 to an $n^{th}$ column output line CLO_n-1, which respectively correspond to the normal pixels NPXs and the AF pixels AFPXs. In some embodiments, while operating in an AF mode, the pixel signals output from the AF pixels AFPXs may include phase signals used to calculate phase differences. The phase signals may include information regarding positions of images formed on the image sensor 100, and an in-focus position of the lens 11_1 may be calculated based on the calculated phase differences. For example, a position of the lens 11_1, at which the phase difference is 0, may be the in-focus position.

The phase signals may be used not only to focus on the object, but also to measure a distance between the object 20 and the image sensor 100. To measure the distance between the object 20 and the image sensor 100, additional information such as the phase differences among the images formed on the image sensor 100, a distance between the lens 11_1 and the image sensor 100, a size of the lens 11_1, the in-focus position of the lens 11_1, etc. may be referenced.

The controller 120 may control the row driver 140 to drive the pixel array 110 in receiving incident light and accumulating corresponding electrical charge, temporarily storing the accumulated electrical charge, and outputting an electrical signal corresponding to the stored electrical charge to a circuit external to the pixel array 110. In addition, the controller 120 may control the signal read-out circuit 150 to measure a level of the pixel signal provided by the pixel array 110.

The row driver 140 may generate signals (e.g., reset control signals RSs, transmission control signals TSs, and selection signals SELSs) to control the pixel array 110, and may provide the signals to the pixels PXs. In some embodiments, the row driver 140 may determine activation/deactivation timing of the reset control signals RSs, the transmission control signals TSs, and the selection signals SELSs provided to the AF pixels AFPXs during the performing of the AF function and/or the distance measurement function.

The CDS 151 may sample and hold the pixel signal provided by the pixel array 110. The CDS 151 may perform double sampling with respect to a level of certain noise and a level according to the pixel signal, thereby outputting levels corresponding to a difference therebetween. In addition, the CDS 151 may receive an input of ramp signals generated by a ramp signal generator 157, compare the pixel signal with the ramp signals, and output a comparison result. The ADC 153 may convert analog signals, which correspond to the levels received from the CDS 151, into digital signals. The buffer 155 may latch the digital signals, and the latched signals may be sequentially output to the signal processor 130 or to the outside of the image sensor 100.

The signal processor 130 may perform signal processing based on pixel signals output from the pixels PX. For example, the signal processor 130 may perform a noise reduction process, a gain adjustment process, a waveform shaping process, an interpolation process, a white balance process, a gamma process, an edge enhancement process, etc. In addition, the signal processor 130 may perform various signal processing based on the phase signals output from the AF pixels AFPXs during an AF operation, and may also output signal-processed information to the processor 12, thereby allowing the processor 12 to perform the phase difference calculation for the AF operation. In some embodiments, the signal processor 130 may provide one or more of these signals to the processor 12.

FIGS. 3, 4A, 4B, 4C and 4D are diagrams respectively illustrating pixel arrays 110A, 110A1, 110A2, 110A3, and 110A4 that may be incorporated into the pixel array 110 of the image sensor 100 of FIG. 2.

Referring to FIG. 3, the pixel array 110A may include pixels NPX1, NPX2, AFPX1, and AFPX2 arranged in the first direction and the second direction. These pixels are one example of the pixels PX of FIG. 2. Here, the pixels NPX1, NPX2, AFPX1, and AFPX2 may include a first normal pixel NPX1 and a second normal pixel NPX2 corresponding to the normal pixel NPX of FIG. 2, and a first AF pixel AFPX1 and a second AF pixel AFPX2 corresponding to the AF pixel AFPX of FIG. 2.

In some embodiments, each of the first normal pixel NPX1 and the second normal pixel NPX2 may have a quadrangular (e.g., rectangular or square) shape. In some embodiments, each of the first AF pixel AFPX1 and the second AF pixel AFPX2 may have an octagonal shape. Hereinafter, geometric terms like "quadrangular", "rectangular," "square", "octagonal", etc. are not intended to denote only ideal (or mathematically precise) shapes and/or relationships. Rather, such terms further denote practically fabricated shapes of varying geometry (e.g., quadrangular, rectangular, square, octagonal, etc.) including slight variation(s) and/or deformation(s), such as rounded corners.

In some other embodiments, each of the first normal pixel NPX1 and the second normal pixel NPX2 may have a non-quadrangular shape, and the first AF pixel AFPX1 and the second AF pixel AFPX2 may have a non-octagonal shape.

The first normal pixel NPX1 may include one photodiode NPD and one microlens MLN disposed on the photodiode NPD, and the second normal pixel NPX2 may include one photodiode NPD and one microlens MLN disposed on the photodiode NPD. Each of the microlenses MLN may refract incident light onto the photodiode NPD of the first normal pixel NPX1 and/or the photodiode NPD of the second normal pixel NPX2.

The first AF pixel AFPX1 may include a first photodiode APD1 and a second photodiode APD2 disposed adjacent to each other in the first direction, and one microlens MLAF disposed on the first photodiode APD1 and the second photodiode APD2. The second AF pixel AFPX2 may include the first photodiode APD1 and the second photodiode APD2 disposed adjacent to each other in the first direction, and the one microlens MLAF disposed on the first photodiode APD1 and the second photodiode APD2.

Because the one microlens MLAF is formed in relation to the first AF pixel AFPX1 and the second AF pixel AFPX2, the respective photo-charge generated by the first photodiodes APD1 and the second photodiodes APD2 may be different due to the shape and/or refractive index of the microlens MLAF. The image sensor 100 may perform the AF function in the first direction using phase signals generated by the first photodiodes APD1 and the second photodiodes APD2.

Alternately, the second AF pixel AFPX2 may include the first photodiode APD1 and the second photodiode APD2 disposed adjacent to each other in the second direction, and the image sensor 100 may perform the AF function in the second direction, using phase signals generated by the first photodiodes APD1 and the second photodiodes APD2 of the second AF pixel AFPX2.

The first normal pixel NPX1 and the first AF pixel AFPX1 may be disposed adjacent to each other in the first direction, and the second AF pixel AFPX2 and the second normal pixel NPX2 may be disposed adjacent to each other in the first direction. Also, the second AF pixel AFPX2 and the first normal pixel NPX1 may be disposed adjacent to each other in the second direction, and the second normal pixel NPX2 and the first AF pixel AFPX1 may be disposed adjacent to each other in the second direction.

In some embodiments, a size of (e.g., an area occupied by) the first AF pixel AFPX1 may be greater than a size of the first normal pixel NPX1, and a size of the second AF pixel AFPX2 may be greater than a size of the second normal pixel NPX2. Also, in some embodiments, the size of the second AF pixel AFPX2 may be greater than a size of the first normal pixel NPX1, and the size of the first AF pixel AFPX1 may be greater than a size of the second normal pixel NPX2. Here, a size of the microlens MLAF included in each of the first AF pixel AFPX1 and the second AF pixel AFPX2 may be greater than a size of the microlens MLN included in each of the first normal pixel NPX1 and the second normal pixel NPX2.

For example, a first length L12 of the first AF pixel AFPX1 in the first direction may be greater than a first length L11 of the first normal pixel NPX1 in the first direction. Alternately or additionally, a second length of the first AF pixel AFPX1 in the second direction may be greater than a second length of the first normal pixel NPX1 in the second direction. Alternately or additionally, a second length L22 of the second AF pixel AFPX2 in the second direction may be greater than a second length L21 of the second normal pixel NPX2 in the second direction. Alternately or additionally, a first length of the second AF pixel AFPX2 in the first direction may be greater than a first length of the second normal pixel NPX2 in the first direction. For example, when the first length L12 of the first AF pixel AFPX1 in the first direction is A+α (given an assumed example, wherein A>α>0), the first length L11 of the first normal pixel NPX1 in the first direction may be A−α. Alternatively, when the second length L22 of the second AF pixel AFPX2 in the second direction is A+α, the second length L21 of the second normal pixel NPX2 in the second direction may be A−α.

Each of the pixels NPX1, NPX2, AFPX1, and AFPX2 may include color filters such that the pixels NPX1, NPX2, AFPX1, and AFPX2 may sense various, respective colors. In some embodiments, the color filters may include at least one of a red color filter RF sensing the color red, a green color filter GF sensing the color green, and a blue color filter BF sensing the color blue.

In some embodiment, the first normal pixel NPX1 may include the red color filter RF, the second normal pixel NPX2 may include the blue color filter BF, and the first and second AF pixels AFPX1 and AFPX2 may include the green color filter GF. For example, the pixels NPX1, NPX2, AFPX1, and AFPX2 may be arranged in a Bayer pattern. However, this is merely an example, and the pixel array 110A according to embodiments of the inventive concept may include various types of color filters. For example, the color filters may include filters sensing yellow, cyan, and magenta colors. Alternately, the color filters may include a white color filter WF sensing white (or all colors).

In some embodiment, the first normal pixel NPX1, the second normal pixel NPX2, the first AF pixel AFPX1, and the second AF pixel AFPX2 may share a floating diffusion region (e.g., FD of FIG. 14), but the pixel array 110A is not limited thereto.

Figure 4A:
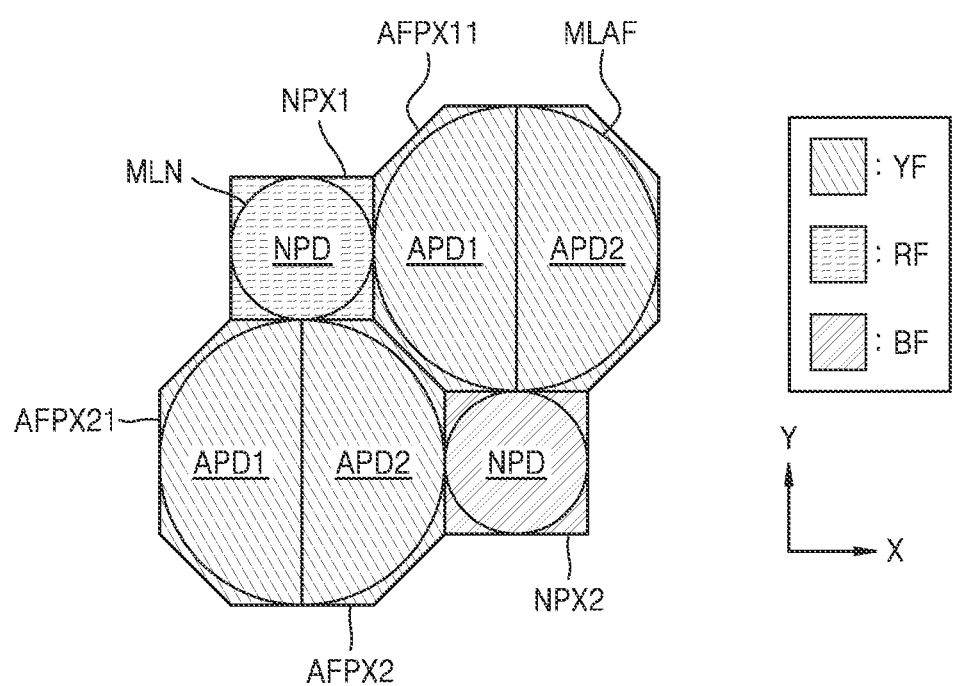

Referring to FIG. 4A, the pixel array 110A1 may include the first normal pixel NPX1, the second normal pixel NPX2, a first AF pixel AFPX11 and a second AF pixel AFPX21 arranged in the first direction and the second direction. In some embodiments, the first normal pixel NPX1 may include the red color filter RF, the second normal pixel NPX2 may include the blue color filter BF, and the first and second AF pixels AFPX11 and AFPX21 may include a yellow color filter YF.

Figure 4B:
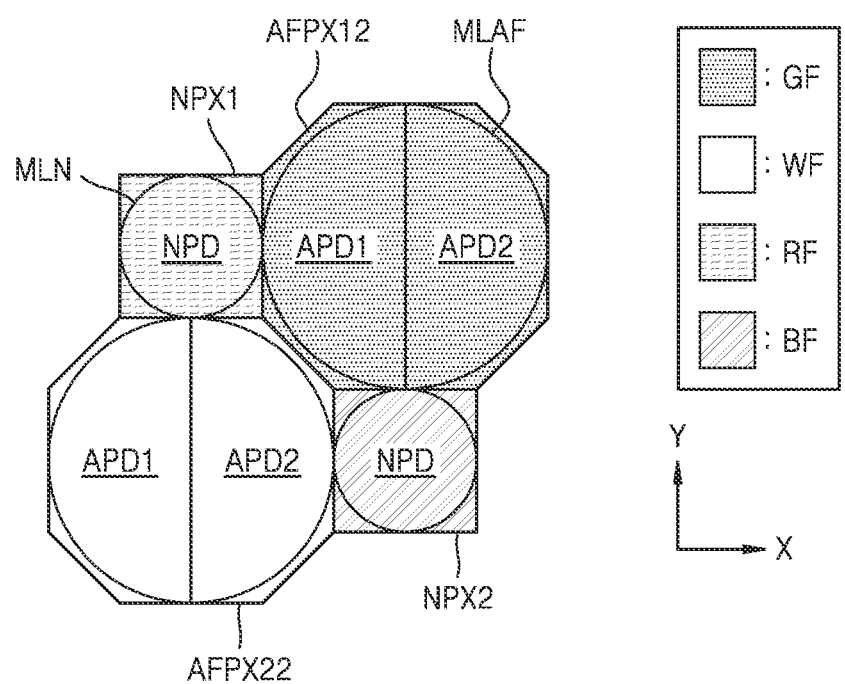

Referring to FIG. 4B, the pixel array 110A2 may include the first normal pixel NPX1, the second normal pixel NPX2, a first AF pixel AFPX12 and a second AF pixel AFPX22 arranged in the first direction and the second direction. In some embodiments, the first normal pixel NPX1 may include the red color filter RF, the second normal pixel NPX2 may include the blue color filter BF, and one of the first and second AF pixels AFPX12 and AFPX22 may include the white color filter WF. For example, one of the first and second AF pixels AFPX12 and AFPX22 may include the white color filter WF, and the other AF pixel may include the green color filter GF. Although FIG. 4B illustrates the example in which the second AF pixel AFPX22 includes the white color filter WF, the first AF pixel AFPX12 may include the white color filter WF.

Figure 4C:
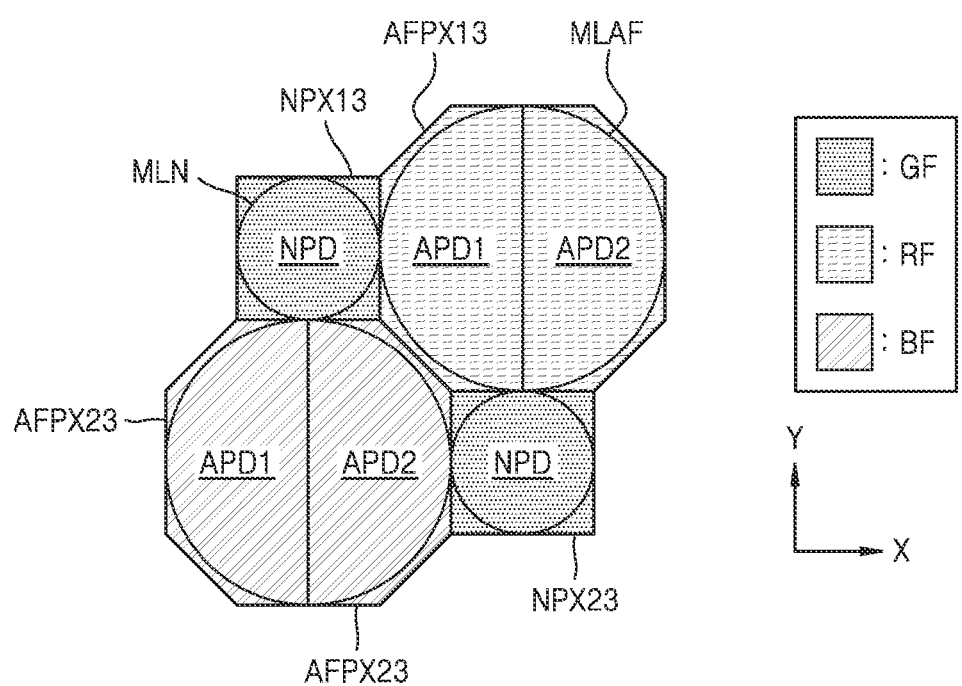

Referring to FIG. 4C, the pixel array 110A3 may include a first normal pixel NPX13, a second normal pixel NPX23, a first AF pixel AFPX13 and a second AF pixel AFPX23 arranged in the first direction and the second direction. In some embodiments, the first normal pixel NPX13 and the second normal pixel NPX23 may include the green color filter GF, first AF pixel AFPX13 may include the red color filter RF, and the second AF pixel AFPX23 may include the blue color filter BF.

Figure 4D:
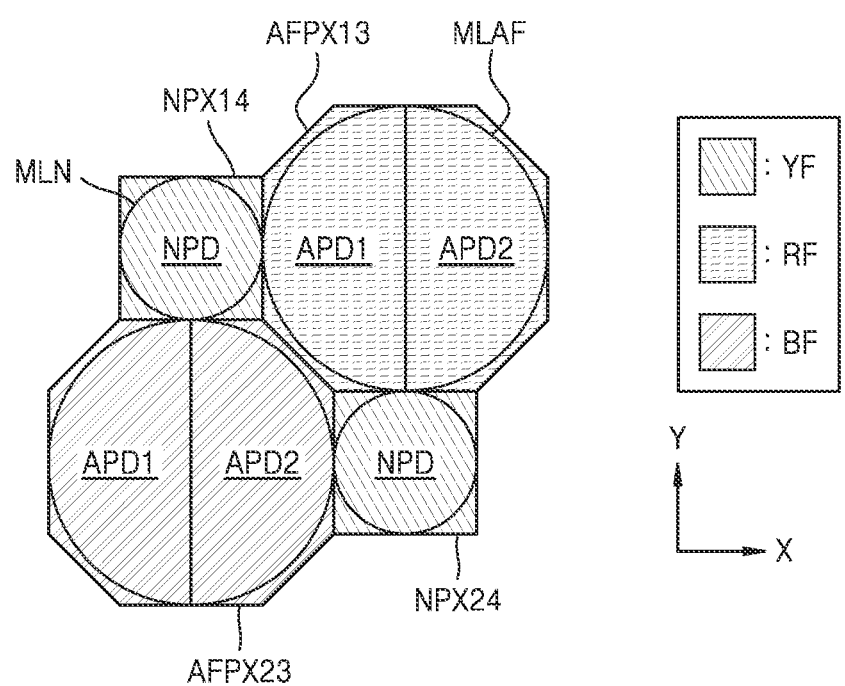

Referring to FIG. 4D, the pixel array 110A4 may include a first normal pixel NPX14, a second normal pixel NPX24, the first AF pixel AFPX13 and the second AF pixel AFPX23 arranged in the first direction and the second direction. In some embodiments, the first normal pixel NPX14 and the second normal pixel NPX24 may include the yellow color filter YF, the first AF pixel AFPX13 may include the red color filter RF, and the second AF pixel AFPX23 may include the blue color filter BF.

Figure 5:
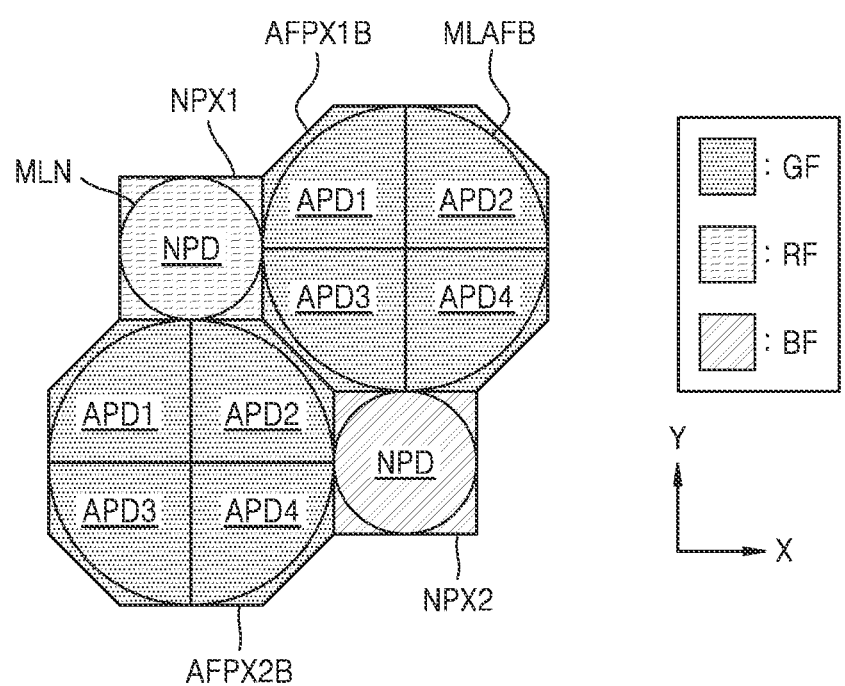

FIG. 5 is a diagram illustrating a pixel array 110B that may be incorporated into the pixel array 110 of the image sensor 100 of FIG. 2. Only material differences between FIGS. 3 and 5 will be described hereafter.

Referring to FIG. 5, the pixel array 110B may include the first normal pixel NPX1, the second normal pixel NPX2, and a first AF pixel AFPX1B, and a second AF pixel AFPX2B arranged in the first direction and the second direction. In some embodiments, each of the first AF pixel AFPX1B and the second AF pixel AFPX2B may have an octagonal shape.

The first AF pixel AFPX1B may include a first photodiode, a second photodiode, a third photodiode and a fourth photodiode APD1, APD2, APD3 and APD4 (hereafter collectively, "first to fourth photodiodes APD1 to APD4") arranged in a first row and a second row in the first direction and in a first column and a second column in the second direction. Thus, the first to fourth photodiodes APD1 to APD4 may be understood as being collectively adjacent or "commonly adjacent to one another in the first direction and the second direction," as shown in FIG. 5. Here, a one microlens MLAFB may be disposed on the first to fourth photodiodes APD1 to APD4. In addition, the second AF pixels AFPX2B may include the first to fourth photodiodes APD1 to APD4 arranged in the first row and the second row in the first direction and in the first column and the second column in the second direction, and the one microlens MLAFB disposed on the first to fourth photodiodes APD1 to APD4.

According to shapes and/or refractive indexes of the micro-lenses MLAFBs, photo-charge respectively generated by the first photodiodes APD1, the second photodiodes APD2, the third photodiodes APD3, and/or the fourth photodiodes APD4 may vary. The image sensor 100 may perform the AF function in the first direction and the second direction using phase signals respectively generated by the first photodiodes APD1, the second photodiodes APD2, the third photodiodes APD3, and the fourth photodiodes APD4.

In some embodiments, a size of the first AF pixel AFPX1B may be greater than a size of the first normal pixel NPX1, and a size of the second AF pixel AFPX2B may be greater than a size of the second normal pixel NPX2. Also, in some embodiments, the size of the second AF pixel AFPX2B may be greater than a size of the first normal pixel NPX1, and the size of the first AF pixel AFPX1B may be greater than a size of the second normal pixel NPX2. A size of the microlens MLAFB included in each of the first AF pixel AFPX1B and the second AF pixel AFPX2B may be greater than a size of the microlens MLN included in each of the first normal pixel NPX1 and the second normal pixel NPX2.

For example, a first length of the first AF pixel AFPX1B in the first direction may be greater than a first length of the first normal pixel NPX1 in the first direction, and a second length of the first AF pixel AFPX1B in the second direction may be greater than a second length of the first normal pixel NPX1 in the second direction. Also, for example, a first length of the second AF pixel AFPX2 in the first direction may be greater than a first length of the second normal pixel NPX2 in the first direction, and a second length of the AF pixel AFPX2B in the second direction may be greater than a second length of the second normal pixel NPX2 in the second direction.

The pixels NPX1, NPX2, AFPX1B, and AFPX2B may respectively include color filters. In some embodiments, the first and second AF pixels AFPX1B and AFPX2B may include the green color filter GF, or the first and second AF pixels AFPX1B and AFPX2B may include the white color filter WF.

In some embodiments, the first normal pixel NPX1, the second normal pixel NPX2, the first AF pixel AFPX1B, and the second AF pixel AFPX2B may share the floating diffusion region (e.g., FD of FIG. 14), but the pixel array 110B is not limited thereto.

Figure 6:
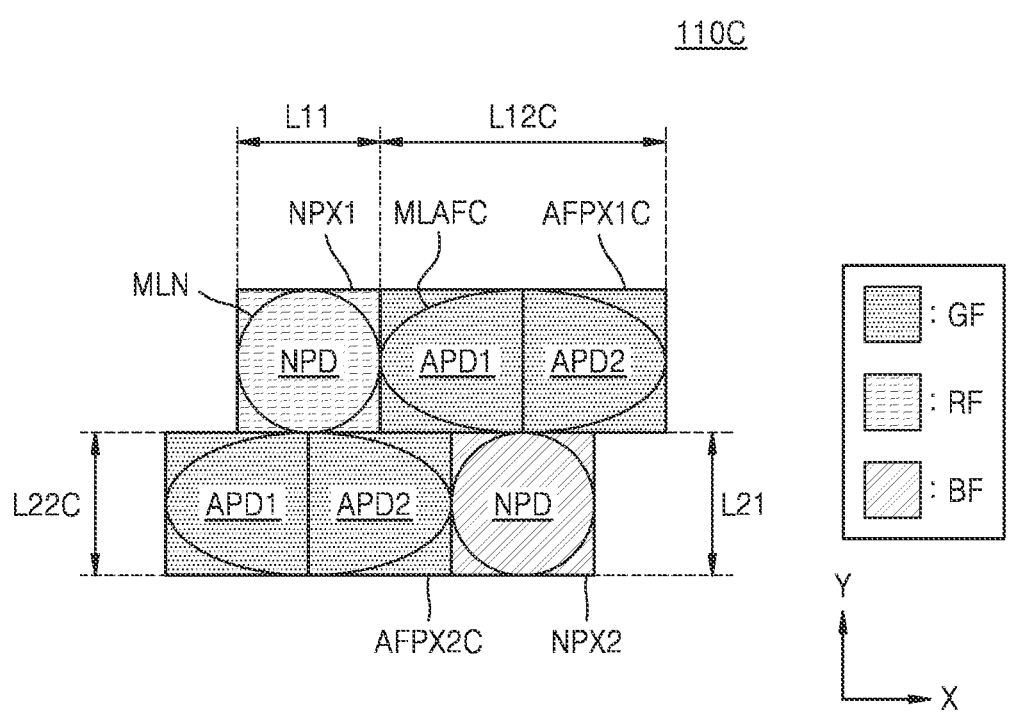

FIG. 6 is a diagram illustrating a pixel array 110C that may be incorporated into the pixel array 110 of the image sensor 100 of FIG. 2. Only material differences between FIGS. 3 and 6 will be described hereafter.

Referring to FIG. 6, the pixel array 110C may include the first normal pixel NPX1, the second normal pixel NPX2, and a first AF pixel AFPX1C, and a second AF pixel AFPX2C arranged in the first direction and the second direction. In some embodiments, each of the first AF pixel AFPX1C and the second AF pixel AFPX2C may have a quadrangular (e.g., a rectangular) shape.

The first AF pixel AFPX1C may include the first photodiode APD1 and the second photodiode APD2 disposed adjacent to each other in the first direction, and one microlens MLAFC disposed on the first photodiode APD1 and the second photodiode APD2. The second AF pixel AFPX2C may include the first photodiode APD1 and the second photodiode APD2 disposed adjacent to each other in the first direction, and the one microlens MLAFC disposed on the first photodiode APD1 and the second photodiode APD2.

In some embodiments, a size of the first AF pixel AFPX1C may be greater than a size of the first normal pixel NPX1, and a size of the second AF pixel AFPX2C may be greater than a size of the second normal pixel NPX2. Also, in some embodiments, the size of the second AF pixel AFPX2C may be greater than a size of the first normal pixel NPX1, and the size of the first AF pixel AFPX1C may be greater than a size of the second normal pixel NPX2. A size of the microlens MLAFC included in each of the first AF pixel AFPX1C and the second AF pixel AFPX2C may be greater than a size of the microlens MLN included in each of the first normal pixel NPX1 and the second normal pixel NPX2, and a width of the microlens MLAFC in the first direction may be greater than that in the second direction.

For example, a first length L12C of the first AF pixel AFPX1C in the first direction may be greater than the first length L11 of the first normal pixel NPX1 in the first direction and a first length of the second AF pixel AFPX2C in the first direction may be greater than a first length of the second normal pixel NPX2 in the first direction. Also, for example, a second length of the first AF pixel AFPX1C in the second direction may be equal to a second length of the first normal pixel NPX1 in the second direction, and a second length L22C of the second AF pixel AFPX2C in the second direction may be equal to the second length L21 of the second normal pixel NPX2 in the second direction.

Alternately, the second length of the first AF pixel AFPX1C in the second direction may be greater than the second length of the first normal pixel NPX1 in the second direction, and the second length L22C of the second AF pixel AFPX2C in the second direction may be greater than the second length L21 of the second normal pixel NPX2 in the second direction.

The pixels NPX1, NPX2, AFPX1C, and AFPX2C may respectively include color filters. In some embodiments, the first and second AF pixels AFPX1C and AFPX2C may include the green color filter GF, or the first and second AF pixels AFPX1C and AFPX2C may include white color filter WF.

In some embodiments, the first normal pixel NPX1, the second normal pixel NPX2, the first AF pixel AFPX1C, and the second AF pixel AFPX2C may share the floating diffusion region (e.g., FD of FIG. 14), but the pixel array 110C is not limited thereto.

Figure 7:
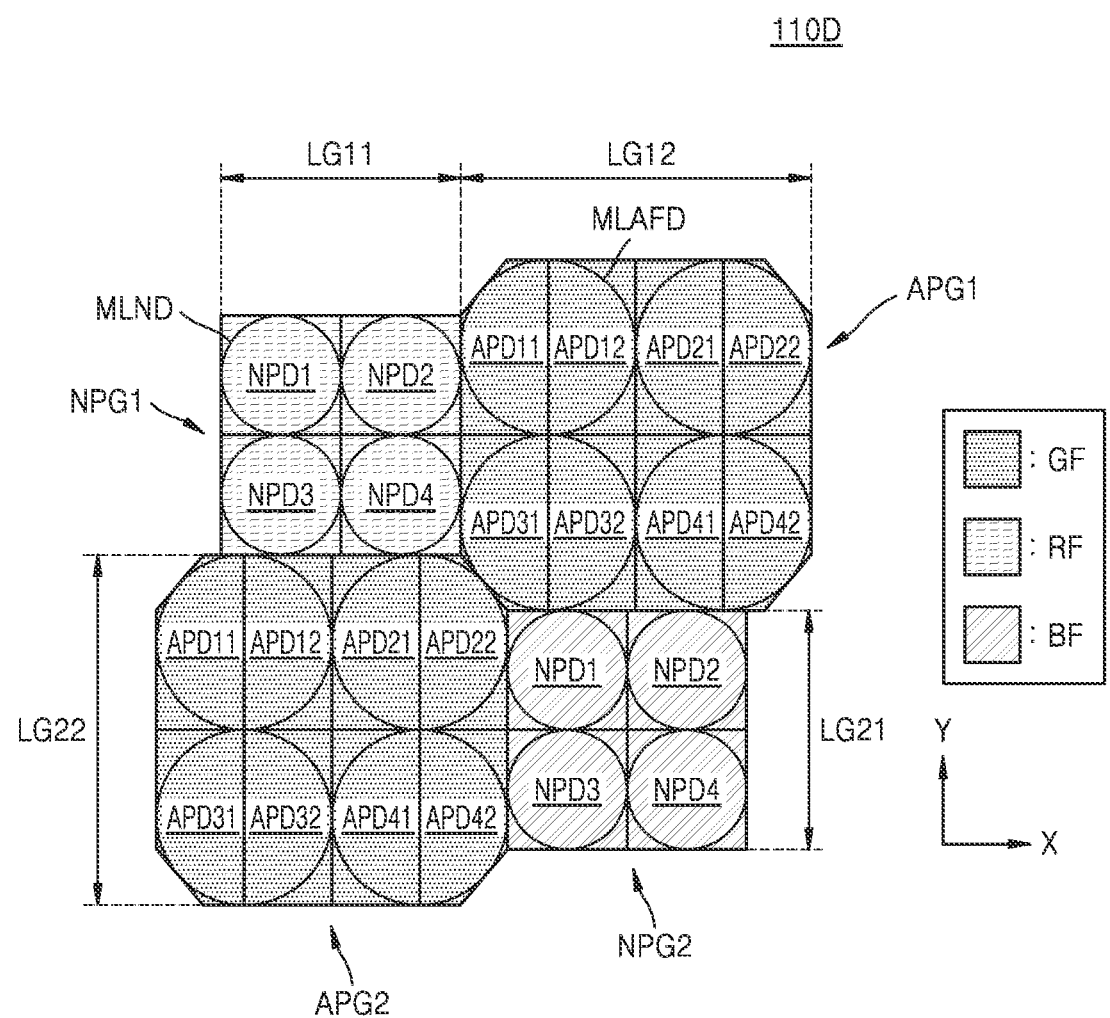
Figure 8:
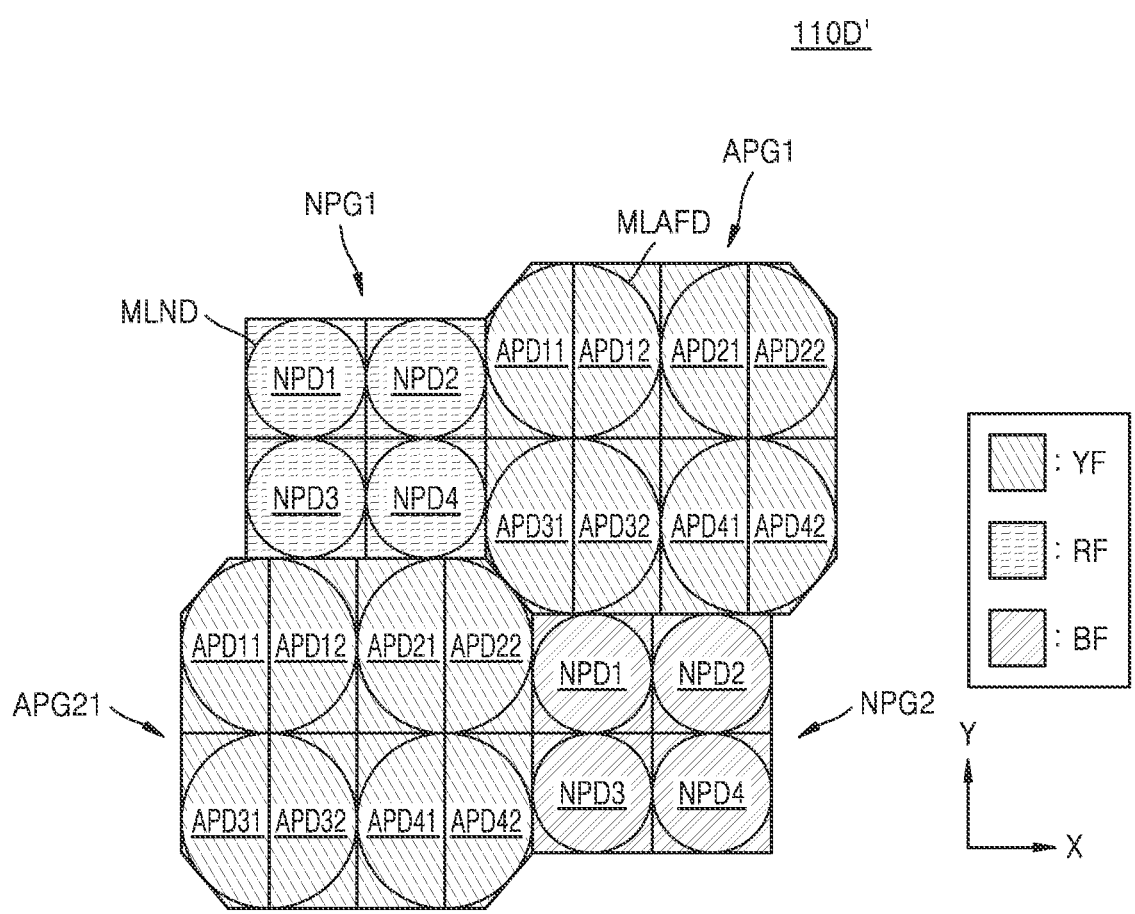

FIGS. 7 and 8 are respective diagrams illustrating pixel arrays 110D and 110D' that may be incorporated into the pixel array 110 of the image sensor 100 of FIG. 2. Only material differences between FIG. 3 and FIGS. 7 and 8 will be described hereafter.

Referring to FIG. 7, the pixel array 110D may include a first normal pixel group NPG1, a second normal pixel group NPG2, a first AF pixel group APG1 and a second AF pixel group APG2 arranged in the first direction and the second direction. Each of the first normal pixel group NPG1 and the second normal pixel group NPG2 may include a normal pixel corresponding to the normal pixel NPX of FIG. 2, and each of the first AF pixel group APG1 and the second AF pixel group APG2 may include an AF pixel corresponding to the AF pixel AFPX of FIG. 2.

In some embodiments, each of the first normal pixel group NPG1 and the second normal pixel group NPG2 may have a quadrangular (e.g., a rectangular or a square) shape. In some embodiments, each of the first AF pixel group APG1 and the second AF pixel group APG2 may have an octagonal shape.

Alternately, the first normal pixel group NPG1, the second normal pixel group NPG2, the first AF pixel group APG1, and the second AF pixel group APG2 may have a shape other than quadrangular or octagonal.

Each of the first normal pixel group NPG1 and the second normal pixel group NPG2 may include first, second, third and fourth normal pixels (hereafter collectively, "first to fourth normal pixels") arranged in two rows and two columns. The first normal pixel may include a first photodiode NPD1 and one microlens MLND disposed on the first photodiode NPD1, the second normal pixel may include a second photodiode NPD2 and one microlens MLND disposed on the second photodiode NPD2, the third normal pixel may include a third photodiode NPD3 and one microlens MLND disposed on the third photodiode NPD3, and the fourth normal pixel may include a fourth photodiode NPD4 and one microlens MLND disposed on the fourth photodiode NPD4. Alternately, the first to fourth normal pixels of the first normal pixel group NPG1 may share one microlens, and the first to fourth normal pixels of the second normal pixel group NPG2 may share one microlens.

In some embodiments, the first to fourth normal pixels of the first normal pixel group NPG1 may include the same color filter, and the first to fourth normal pixels of the second normal pixel group NPG2 may include the same color filter.

Each of the first AF pixel group APG1 and the second AF pixel group APG2 may include first, second, third and fourth AF pixels (hereafter collectively, "first to fourth AF pixels") arranged in two rows and two columns. The first AF pixel may include a first photodiode APD11 and a second photodiode APD12 disposed adjacent to each other in the first direction, and one microlens MLAFD disposed on the first photodiode APD11 and the second photodiode APD12. The second AF pixel may include a first photodiode APD21 and a second photodiode APD22 disposed adjacent to each other in the first direction, and one microlens MLAFD disposed on the first photodiode APD21 and the second photodiode APD22. The third AF pixel may include a first photodiode APD31 and a second photodiode APD32 disposed adjacent to each other in the first direction, and one microlens MLAFD disposed on the first photodiode APD31 and the second photodiode APD32, and the fourth AF pixel may include a first photodiode APD41 and a second photodiode APD42 disposed adjacent to each other in the first direction, and one microlens MLAFD disposed on the first photodiode APD41 and the second photodiode APD42. In some embodiments, the first to fourth AF pixels of the first AF pixel group APG1 may include the same color filter, and the first to fourth AF pixels of the second AF pixel group APG2 may include the same color filter.

The first normal pixel group NPG1 and the first AF pixel group APG1 may be disposed adjacent to each other in the first direction, and the second AF pixel group APG2 and the second normal pixel group NPG2 may be disposed adjacent to each other in the first direction. In addition, the second AF pixel group APG2 and the first normal pixel group NPG1 may be disposed adjacent to each other in the second direction, and the second normal pixel group NPG2 and the first AF pixel group APG1 may be disposed adjacent to each other in the second direction.

In some embodiments, a size of the first AF pixel group APG1 may be greater than a size of the first normal pixel group NPG1, and a size of the second AF pixel group APG2 may be greater than a size of the second normal pixel group NPG2. Also, in some embodiments, the size of the second AF pixel group APG2 may be greater than a size of the first normal pixel group NPG1, and the size of the first AF pixel group APG1 may be greater than a size of the second normal pixel group NPG2.

For example, a first length LG12 of the first AF pixel group APG1 in the first direction may be greater than a first length LG11 of the first normal pixel group NPG1 in the first direction. Alternately, a second length of the first AF pixel group APG1 in the second direction may be greater than a second length of the first normal pixel group NPG1 in the second direction. Also, for example, a second length LG22 of the second AF pixel group APG2 in the second direction may be greater than a second length LG21 of the second normal pixel group NPG2 in the second direction. Alternately, a first length of the second AF pixel group APG2 in the first direction may be greater than a first length of the second normal pixel group NPG2 in the first direction. For example, when the first length LG12 of the first AF pixel group APG1 in the first direction is A'+α' (in an assumed case, wherein A'>α'>0), the first length LG11 of the first normal pixel group NPG1 in the first direction may be A'−α'. Alternately, for example, when the second length LG22 of the second AF pixel group APG2 in the second direction is A'+α', the second length LG12 of the second normal pixel group NPG2 in the second direction may be A'−α'.

In order to sense various colors, the first normal pixel group NPG1, the second normal pixel group NPG2, the first AF pixel group APG1, and the second AF pixel group APG2 may include various color filters. In some embodiments, the first to fourth normal pixels of the first normal pixel group NPG1 may include the red color filter RF, the first to fourth normal pixels of the second normal pixel group NPG2 may include the blue color filter BF, the first to fourth AF pixels of the first AF pixel group APG1 may include the green color filter GF, and the first to fourth AF pixels of the second AF pixel group APG2 may include the green color filter GF. However, this is only an example, and the pixel array 110D according to an embodiment of the inventive concept may include various types of color filters.

In some embodiments, the first to fourth normal pixels included in the first normal pixel group NPG1 may share the floating diffusion region (e.g., FD in FIG. 14), and the first to fourth normal pixels included in the second normal pixel group NPG2 may share the floating diffusion region FD, but the pixel array 110D is not limited thereto. Also, in some embodiments, the first to fourth normal pixels included in the first AF pixel group APG1 may share the floating diffusion region FD, and the first to fourth normal pixels included in the second AF pixel group APG2 may share the floating diffusion region FD, but the pixel array 110D is not limited thereto.

Referring to FIG. 8 in contrast to FIG. 7, the pixel array 110D' may include the first normal pixel group NPG1, the second normal pixel group NPG2, a first AF pixel group APG1', and a second AF pixel group APG2'. In some embodiments, the first normal pixel group NPG1 may include the red color filter RF, the second normal pixel group NPG2 may include the blue color filter BF, and the first and second AF pixel groups APG1' and APG2' may include the yellow color filter YF.

However, the arrangement of the color filters shown in FIGS. 7 and 8 is merely exemplary, and the scope of the inventive concept is not limited thereto. For example, one AF pixel group of the first and second AF pixel groups may include the yellow color filter YF, and the other AF pixel group may include the green color filter GF. Alternately, for example, the first and second normal pixel groups may include the green color filter GF, the first AF pixel group may include the red color filter RF, and the second AF pixel group may include the blue color filter BF. Alternately, for example, the first and second normal pixel groups may include the yellow color filter YF or the white color filter WF, the first AF pixel group may include the red color filter RF, and the second AF pixel group may include the blue color filter BF.

FIGS. 9A, 9B, 9C and 9D are diagrams respectively illustrating pixel arrays 110D1, 110D2, 110D3 and 110D4 that may be incorporated into the pixel array 110 of the image sensor 100 of FIG. 2. The embodiments of FIGS. 9A and 9B may be considered in relation to the embodiment of FIG. 7, for example.

Figure 9A:
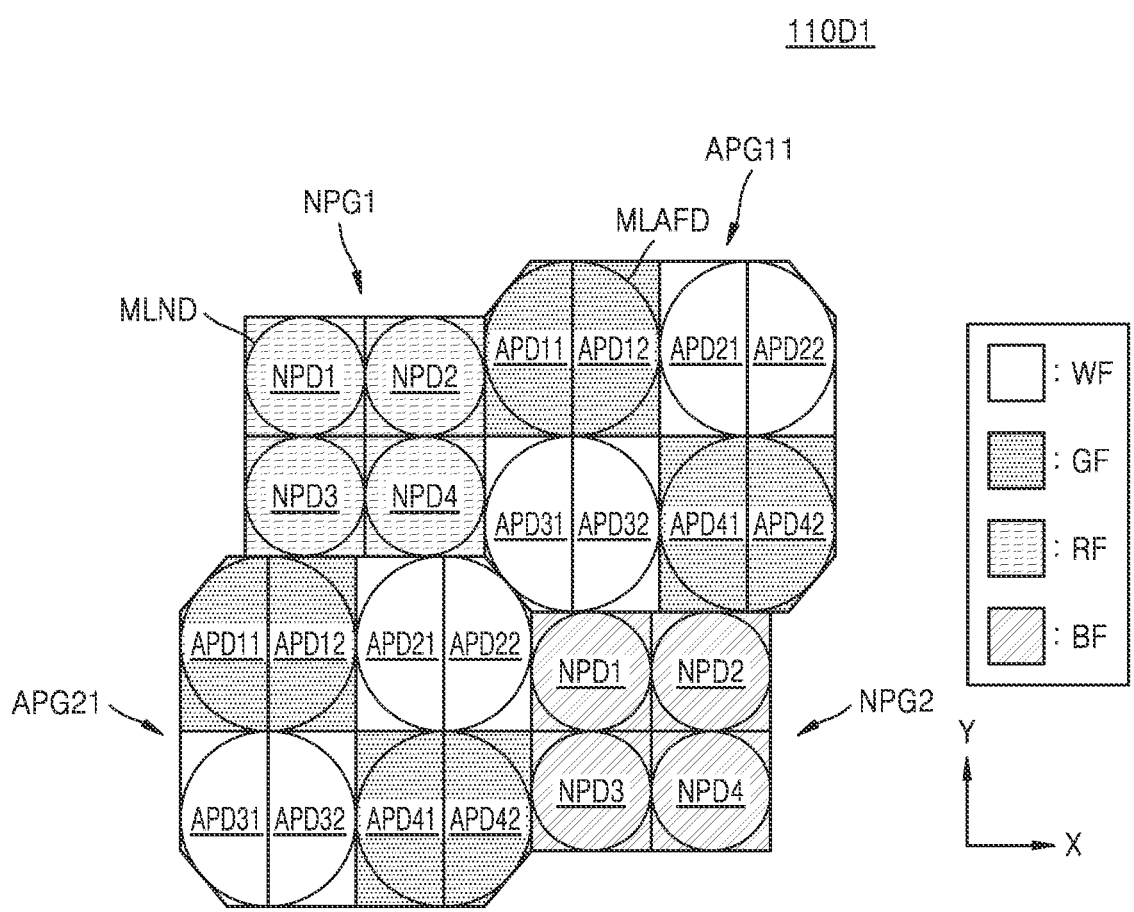

Referring to FIG. 9A, the pixel array 110D1 may include the first normal pixel group NPG1, the second normal pixel group NPG2, a first AF pixel group APG11, and a second AF pixel group APG21. In some embodiments, the first normal pixel group NPG1 may include the red color filter RF, the second normal pixel group NPG2 may include the blue color filter BF, and the first and second AF pixel groups APG11 and APG21 may include the green color filter GF and the white color filter WF. For example, a first pixel and a fourth pixel included in each of the first and second AF pixel groups APG11 and APG21 may include the green color filter GF, and a second pixel and a third pixel thereof may include the white color filter WF. The first pixel and the fourth pixel of each of the first and second AF pixel groups APG11 and APG21 may be disposed along a first diagonal line with respect to the first direction and the second direction, and the second pixel and the third pixel thereof may be disposed along a second diagonal line with respect to the first direction and the second direction. Here, the first diagonal line and the second diagonal line may intersect.

Figure 9B:
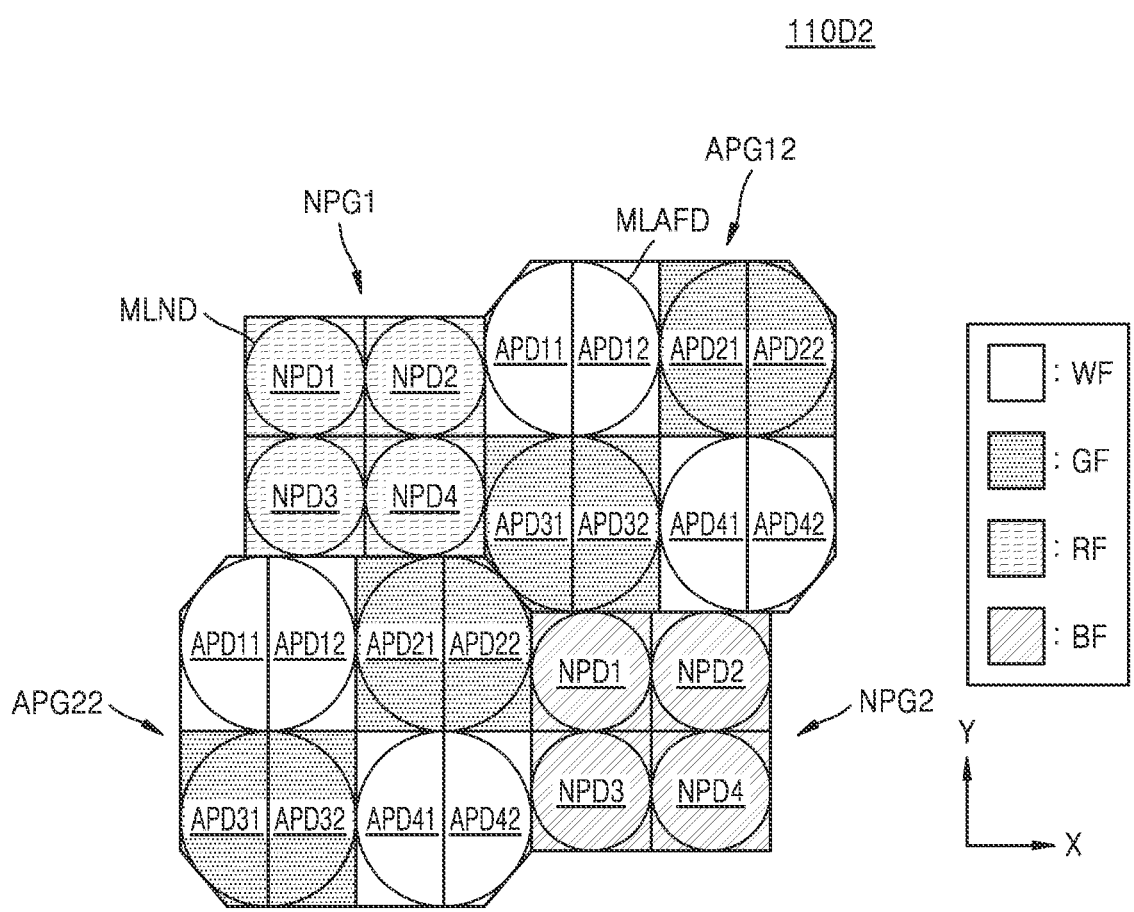

Referring to FIG. 9B, the pixel array 110D2 may include the first normal pixel group NPG1, the second normal pixel group NPG2, the first AF pixel group APG12, and the second AF pixel group APG22. In some embodiments, the first normal pixel group NPG1 may include the red color filter RF, the second normal pixel group NPG2 may include the blue color filter BF, and the first and second AF pixel groups APG12 and APG22 may include the green color filter GF and the white color filter WF. For example, the second pixel and the third pixel included in each of the first and second AF pixel groups APG12 and APG22 may include the green color filter GF, and the first pixel and the fourth pixel thereof may include the white color filter WF.

Figure 9C:
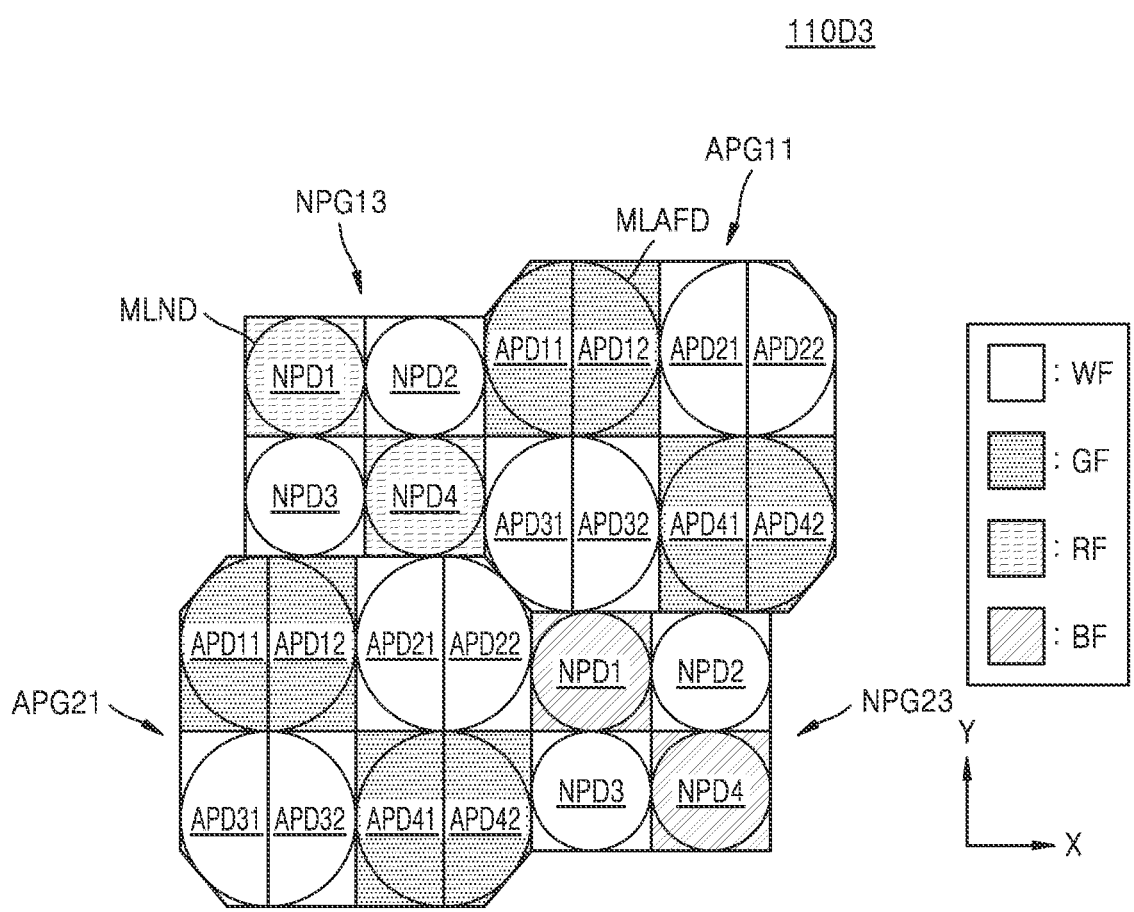

Referring to FIG. 9C, further in relation to FIG. 9A, the pixel array 110D3 may include a first normal pixel group NPG13, a second normal pixel group NPG23, the first AF pixel group APG11, and the second AF pixel group APG21. In some embodiments, the first normal pixel group NPG13 may include the red color filter RF and the white color filter WF. For example, the first and fourth pixels included in the first normal pixel group NPG13 may include the red color filter RF, and the second and third pixels thereof may include the white color filter WF. Also, in some embodiments, the second normal pixel group NPG23 may include the blue color filter BF and the white color filter WF. For example, the first pixel and the fourth pixel included in the second normal pixel group NPG23 may include the blue color filter BF, and the second and third pixels thereof may include the white color filter WF. The first and fourth pixels of each of the first and second normal pixel groups NPG13 and NPG23 may be disposed along a first diagonal line with respect to the first direction and the second direction, and the second and third pixels of each of the first and second normal pixel groups NPG13 and NPG23 may be disposed along a second diagonal line with respect to the first direction and the second direction. Here, the first diagonal line and the second diagonal line may intersect.

Figure 9D:
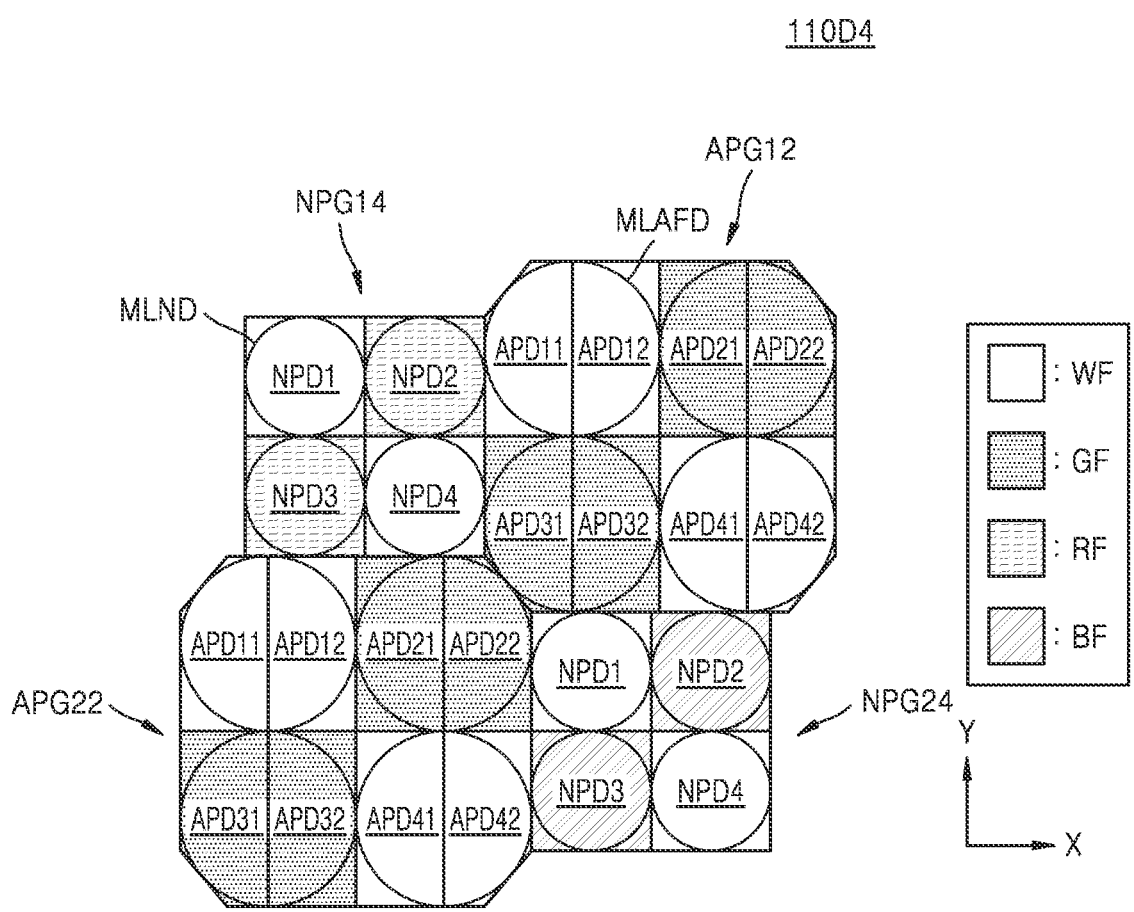

Referring to FIG. 9D, further in relation to FIG. 9B, the pixel array 110D4 may include a first normal pixel group NPG14, a second normal pixel group NPG24, a first AF pixel group APG12, and a second AF pixel group APG22. In some embodiments, the first normal pixel group NPG14 may include the red color filter RF and the white color filter WF. For example, the second and third pixels included in the first normal pixel group NPG14 may include the red color filter RF, and the first and fourth pixels thereof may include the white color filter WF. Also, in some embodiments, the second normal pixel group NPG24 may include the blue color filter BF and the white color filter WF. For example, the second and third pixels included in the second normal pixel group NPG24 may include the blue color filter BF, and the first and fourth pixels thereof may include the white color filter WF.

Here, the arrangements of the color filters described in relation to the embodiments of FIGS. 9A, 9B, 9C and 9D are merely exemplary, and the scope of the inventive concept is not limited thereto. That is, an arrangement of the color filters may vary with design.

Figure 10:
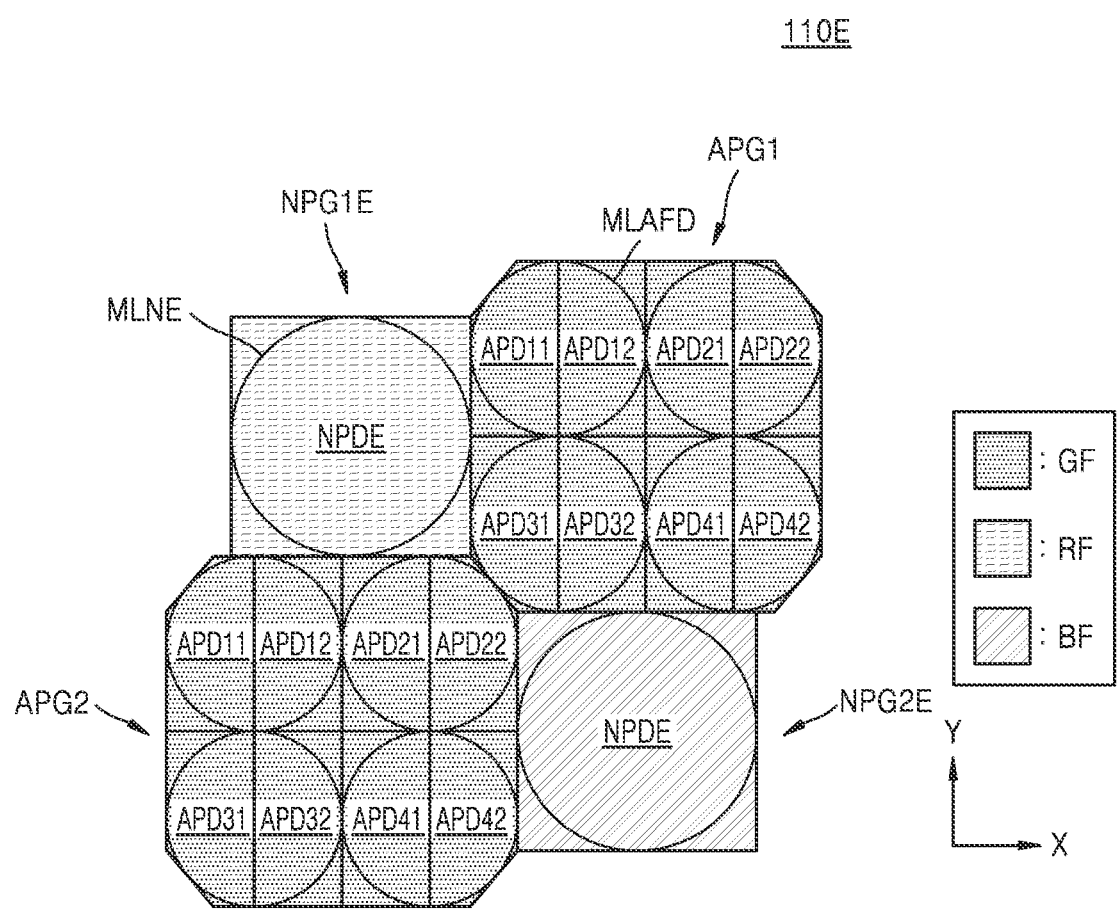

FIG. 10 is a diagram illustrating a pixel array 110E that may be incorporated into the pixel array 110 of the image sensor 100 of FIG. 2. The embodiment of FIG. 10 may be considered in relation to the embodiment of FIG. 7, for example.

Referring to FIG. 10, the pixel array 110E may include a first normal pixel group NPG1E, a second normal pixel group NPG2E, the first AF pixel group APG1, and the second AF pixel group APG2. Each of the first normal pixel group NPG1E and the second normal pixel group NPG2E may include a normal pixel corresponding to the normal pixel NPX of FIG. 2, and each of the first AF pixel group APG1 and the second AF pixel group APG2 may include an AF pixel corresponding to the AF pixel AFPX of FIG. 2.

In some embodiments, each of the first normal pixel group NPG1E and the second normal pixel group NPG2E may have a quadrangular (e.g., a rectangular or a square) shape. Each of the first normal pixel group NPG1E and the second normal pixel group NPG2E may include one normal pixel including one photodiode NPDE and one microlens MLNE disposed on one photodiode NPDE.

The first normal pixel group NPG1E and the first AF pixel group APG1 may be disposed adjacent to each other in the first direction, and the second AF pixel group APG2 and the second normal pixel group NPG2E may be disposed adjacent to each other in the first direction. Also, the second AF pixel group APG2 and the first normal pixel group NPG1E may be disposed adjacent to each other in the second direction, and the second normal pixel group NPG2E and the first AF pixel group APG1 may be disposed adjacent to each other in the second direction.

In some embodiments, a size of the first AF pixel group APG1 may be greater than a size of the first normal pixel group NPG1E, and a size of the second AF pixel group APG2 may be greater than a size of the second normal pixel group NPG2E. Also, in some embodiments, the size of the second AF pixel group APG2 may be greater than a size of the first normal pixel group NPG1E, and the size of the first AF pixel group APG1 may be greater than a size of the second normal pixel group NPG2E. For example, a first length of the first AF pixel group APG1 in the first direction may be greater than a first length of the first normal pixel group NPG1E in the first direction, and a second length of the first AF pixel group APG1 in the second direction may be greater than a second length of the first normal pixel group NPG1E in the second direction. Also, for example, a first length of the second AF pixel group APG2 in the first direction may be greater than a first length of the second normal pixel group NPG2E in the first direction, and a second length of the second AF pixel group APG2 in the second direction may be greater than a second length of the second normal pixel group NPG2E in the second direction.

In some embodiments, a normal pixel of the first normal pixel group NPG1E may include the red color filter RF, and a normal pixel of the second normal pixel group NPG2E may include blue color filter BF. However, the pixel array 110E is not limited thereto.

Figure 11A:
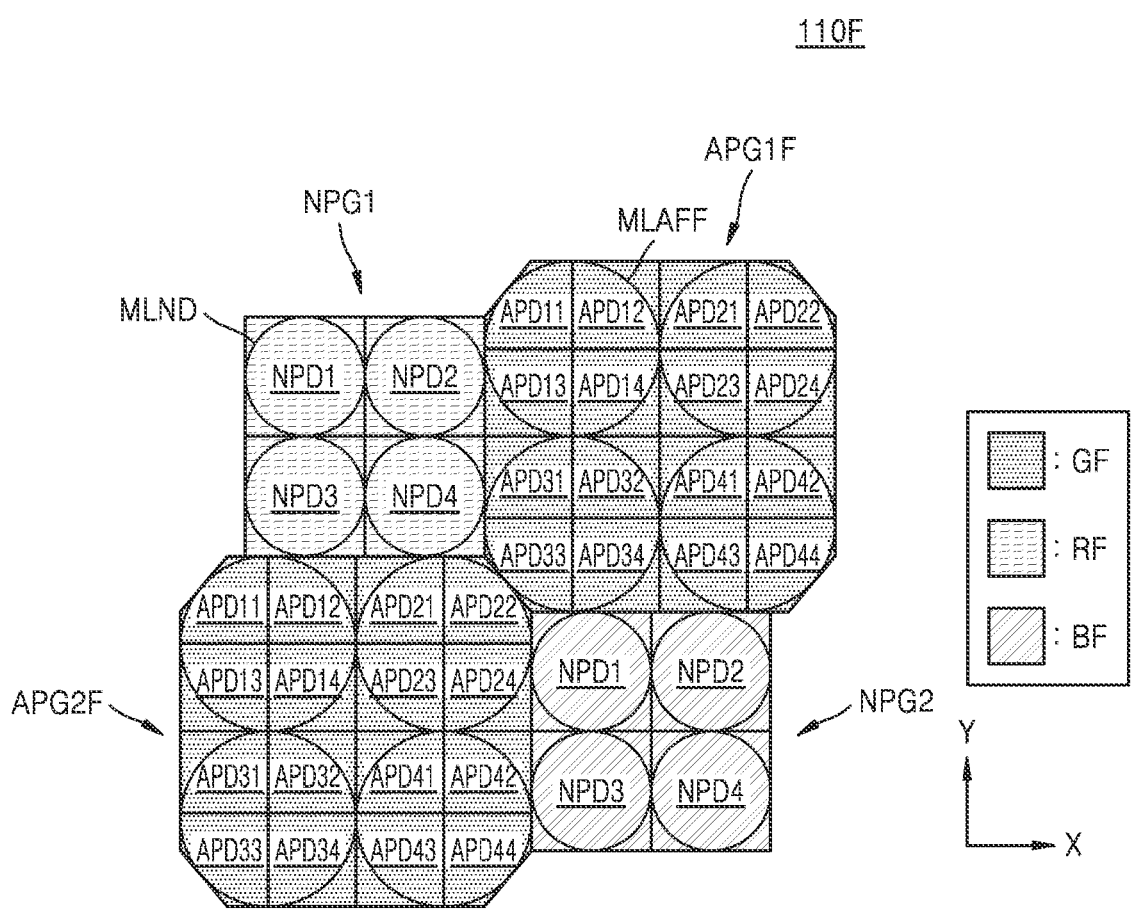
Figure 11B:
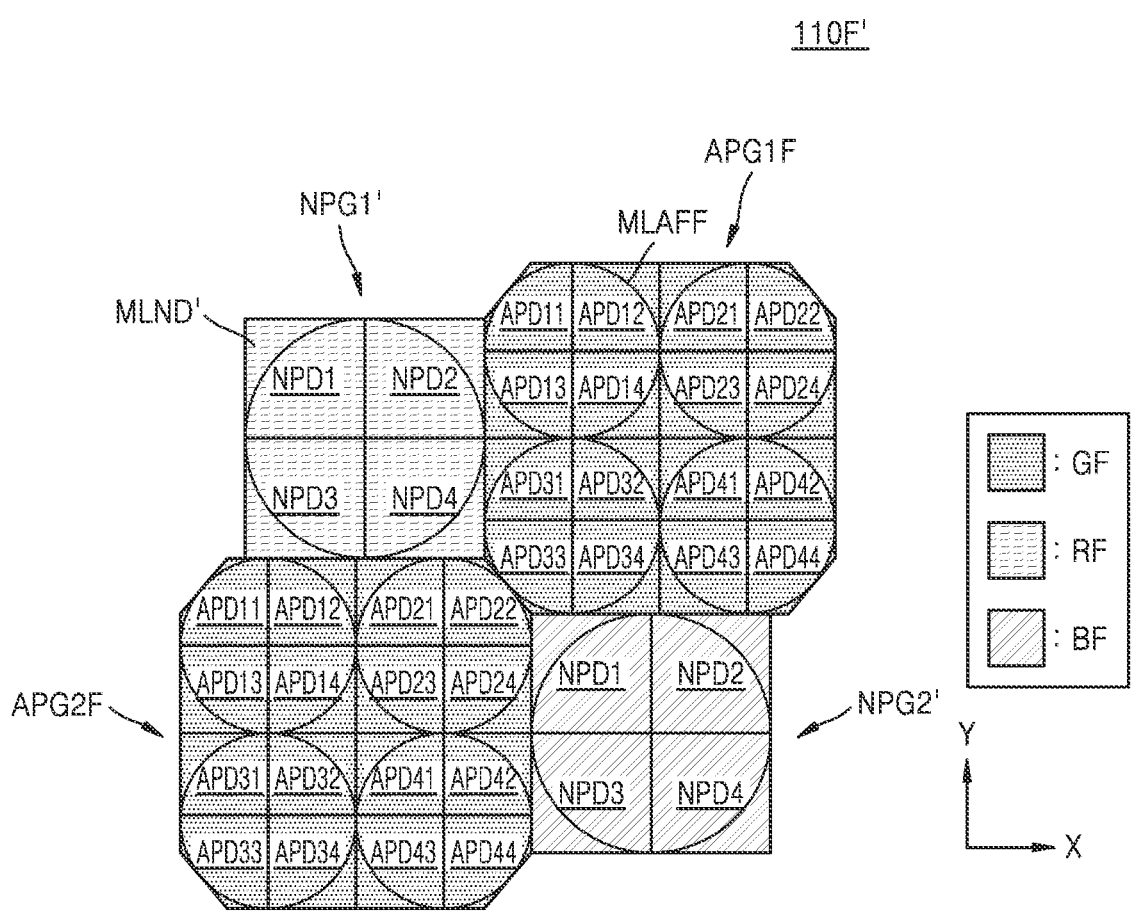

FIGS. 11A and 11B are diagrams respectively illustrating pixel arrays 110F and 110F' that may be incorporated into the pixel array 110 of the image sensor 100 of FIG. 2. The embodiments of FIGS. 11A and 11B may be considered in relation to the embodiment of FIG. 7, for example.

Referring to FIG. 11A, the pixel array 110F may include the first normal pixel group NPG1, the second normal pixel group NPG2, a first AF pixel group APG1F, and a second AF pixel group APG2F. Each of the first normal pixel group NPG1 and the second normal pixel group NPG2 may include a normal pixel corresponding to the normal pixel NPX of FIG. 2, and each of the first AF pixel group APG1F and the second AF pixel groups APG2F may include an AF pixel corresponding to the AF pixel AFPX of FIG. 2. In some embodiments, each of the first AF pixel group APG1F and the second AF pixel group APG2F may have an octagonal shape.

Each of the first AF pixel group APG1F and the second AF pixel group APG2F may include first to fourth AF pixels. The first AF pixel may include first to fourth photodiodes APD11 to APD14 arranged in two rows and two columns and one microlens MLAFF disposed on the first to fourth photodiodes APD11 to APD14. The second AF pixel may include first to fourth photodiodes APD21 to APD24 arranged in two rows and two columns and one microlens MLAFF disposed on the first to fourth photodiodes APD21 to APD24. The third AF pixel may include first to fourth photodiodes APD31 to APD34 arranged in two rows and two columns and one microlens MLAFF disposed on the first to fourth photodiodes APD31 to APD34. The fourth AF pixel may include first to fourth photodiodes APD41 to APD44 arranged in two rows and two columns and one microlens MLAFF disposed on the first to fourth photodiodes APD41 to APD44.

In some embodiments, a size of the first AF pixel group APG1F may be greater than a size of the first normal pixel group NPG1, and a size of the second AF pixel group APG2F may be greater than a size of the second normal pixel group NPG2. Also, in some embodiments, the size of the second AF pixel group APG2F may be greater than a size of the first normal pixel group NPG1, and the size of the first AF pixel group APG1F may be greater than a size of the second normal pixel group NPG2. For example, a first length of the first AF pixel group APG1F in the first direction may be greater than a first length of the first normal pixel group NPG1 in the first direction, and a second length of the first AF pixel group APG1F in the second direction may be greater than a second length of the first normal pixel group NPG1 in the second direction. Also, for example, a first length of the second AF pixel group APG2F in the first direction may be greater than a first length of the second normal pixel group NPG2 in the first direction, and a second length of the second AF pixel group APG2F in the second direction may be greater than a second length of the second normal pixel group NPG2 in the second direction.

In some embodiments, the first to fourth AF pixels of the first AF pixel group APG1F may include at least one of the green color filter GF and a white color filter.

In some embodiments, the first to fourth AF pixels included in the first AF pixel group APG1F may share the floating diffusion region (e.g., FD in FIG. 14), and the first to fourth AF pixels included in the second AF pixel group APG2F may share the floating diffusion region FD, but the pixel array 110F is not limited thereto.

Referring to FIG. 11B, further in relation to FIG. 11A, the pixel array 110F' may include a first normal pixel group NPG1', a second normal pixel group NPG2', the first AF pixel group APG1F, and the second AF pixel group APG2F. The first to fourth normal pixels of the first normal pixel group NPG1' may share one microlens MLND'. The first to fourth normal pixels of the second normal pixel group NPG2' may share one microlens MLND'.

Figure 12A:
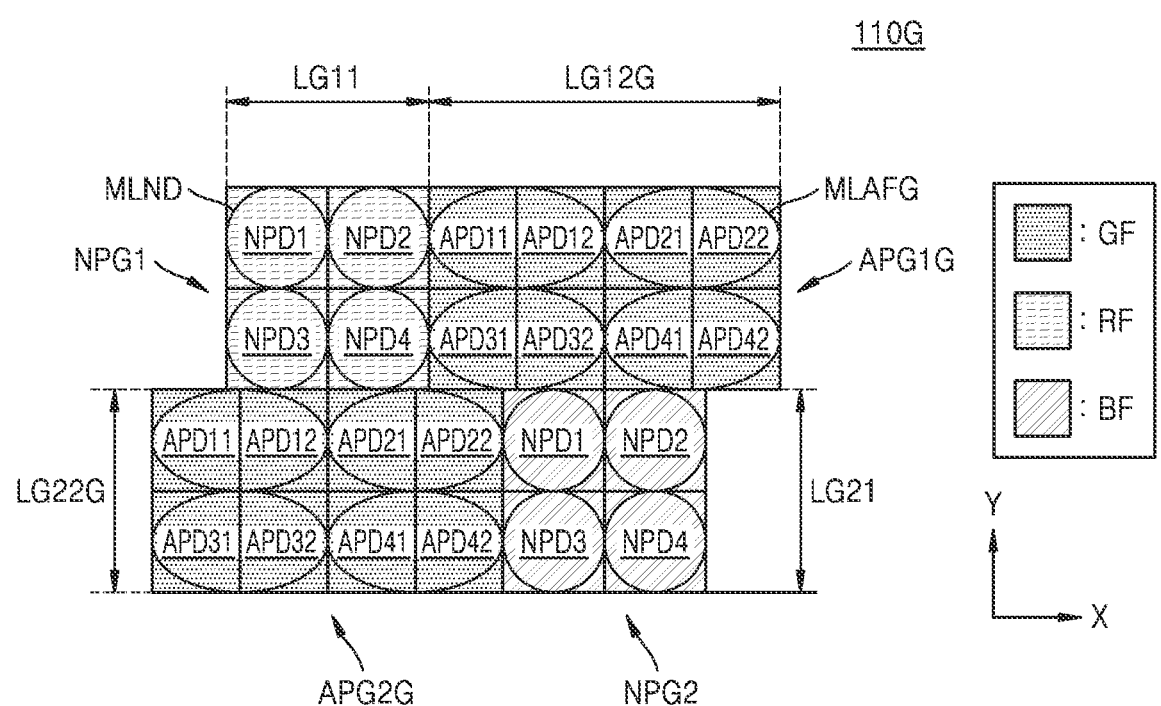
Figure 12B:
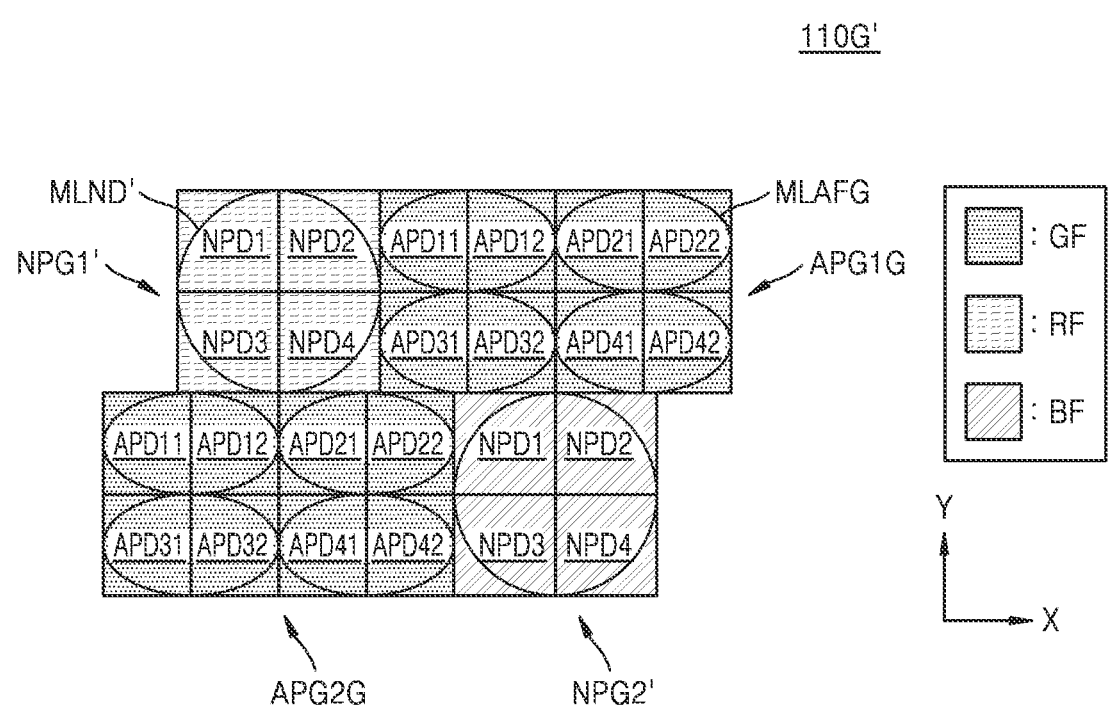

FIGS. 12A and 12B are diagrams respectively illustrating pixel arrays 110G and 110G' that may be incorporated into the pixel array 110 of the image sensor 100 of FIG. 2. The embodiments of FIGS. 12A and 12B may be considered in relation to the embodiment of FIG. 7, for example.

Referring to FIG. 12A, the pixel array 110G may include the first normal pixel group NPG1, the second normal pixel group NPG2, a first AF pixel group APG1G, and a second AF pixel group APG2G. Each of the first normal pixel group NPG1 and the second normal pixel group NPG2 may include a normal pixel corresponding to the normal pixel NPX of FIG. 2, and each of the first AF pixel group APG1G and the second AF pixel group APG2G may include an AF pixel corresponding to the AF pixel AFPX of FIG. 2. In some embodiments, each of the first AF pixel group APG1G and the second AF pixel group APG2G may have a quadrangular (e.g., a rectangular) shape.

Each of the first AF pixel group APG1G and the second AF pixel group APG2G may include first to fourth AF pixels. The first AF pixel may include the first photodiode APD11 and the second photodiode APD12 disposed adjacent to each other in the first direction, and one microlens MLAFG disposed on the first photodiode APD11 and the second photodiode APD12. The second AF pixel may include the first photodiode APD21 and the second photodiode APD22 disposed adjacent to each other in the first direction, and one microlens MLAFG disposed on the first photodiode APD21 and the second photodiode APD22. The third AF pixel may include the first photodiode APD31 and the second photodiode APD32 disposed adjacent to each other in the first direction, and one microlens MLAFG disposed on the first photodiode APD31 and the second photodiode APD32, and the fourth AF pixel may include the first photodiode APD41 and the second photodiode disposed APD42 disposed adjacent to each other in the first direction, and one microlens MLAFG disposed on the first photodiode APD41 and the second photodiode APD42. In some embodiments, a width of the microlens MLAFG in the first direction may be greater than a width in the second direction.

In some embodiments, a size of the first AF pixel group APG1G may be greater than a size of the first normal pixel group NPG1, and a size of the second AF pixel group APG2G may be greater than a size of the second normal pixel group NPG2. Also, in some embodiments, the size of the second AF pixel group APG2G may be greater than a size of the first normal pixel group NPG1, and the size of the first AF pixel group APG1G may be greater than a size of the second normal pixel group NPG2.

For example, a first length LG12G of the first AF pixel group APG1G in the first direction may be greater than a first length LG11 of the first normal pixel group NPG1 in the first direction, and a first length of the second AF pixel group APG2G in the first direction may be greater than a first length of the second normal pixel group NPG2 in the first direction. Also, for example, a second length of the first AF pixel group APG1G in the second direction may be equal to a second length of the first normal pixel group NPG1 in the second direction, and a second length LG22G of the second AF pixel group APG2G in the second direction may be equal to a second length LG21 of the second normal pixel group NPG2 in the second direction. However, unlike shown in FIG. 12A, for example, the second length of the first AF pixel group APG in the second direction may be greater than the second length of the first normal pixel group NPG1 in the second direction, and the second length LG22G of the second AF pixel group APG2G in the second direction may be greater than the second length LG21 of the second normal pixel group NPG2 in the second direction.

The first normal pixel group NPG1, the second normal pixel group NPG2, the first AF pixel group APG1G, and the second AF pixel group APG2G may include various color filters. In some embodiments, the AF pixels included in the first AF pixel group APG1G and the second AF pixel group APG2G may include the green color filter GF or a white color filter.

In some embodiments, the first to fourth normal pixels included in the first AF pixel group APG1G may share the floating diffusion region (e.g., FD in FIG. 14), and the first to fourth normal pixels included in the second AF pixel group APG2G may share the floating diffusion region FD, but the pixel array 110G is not limited thereto.

Referring to FIG. 12B, further in relation to FIG. 12A, the pixel array 110G' may include a first normal pixel group NPG1', a second normal pixel group NPG2', a first AF pixel group APG1G and a second AF pixel group APG2G. The first to fourth normal pixels of the first normal pixel group NPG1' may share one microlens MLND'. The first to fourth normal pixels of the second normal pixel group NPG2' may share one microlens MLND'.

Figure 13:
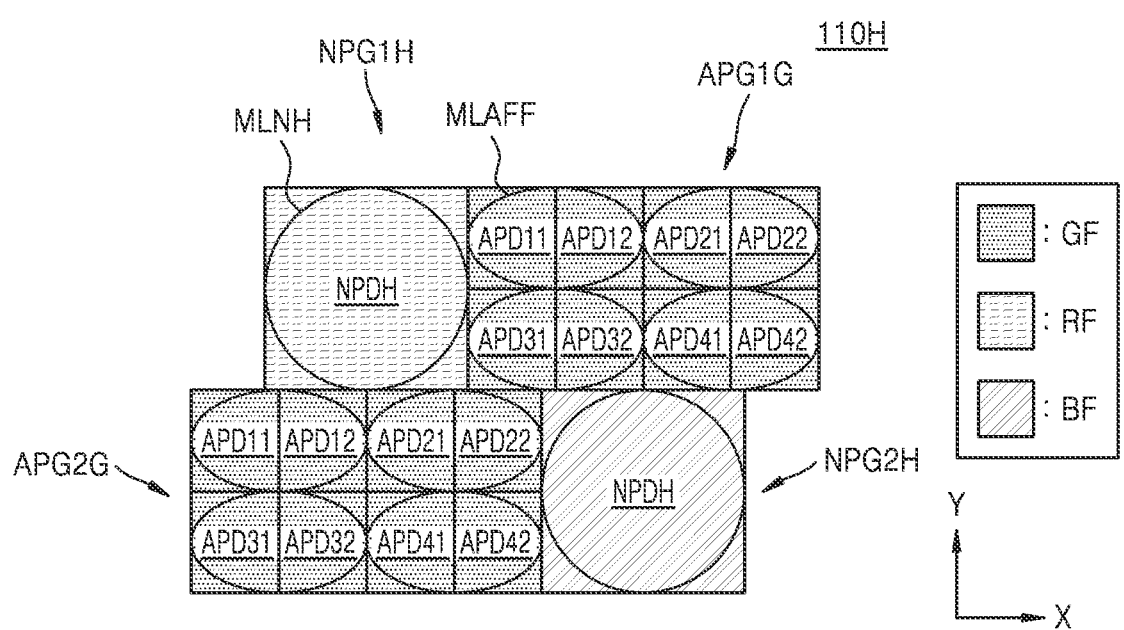

FIG. 13 is a diagram illustrating a pixel array 110H that may be incorporated into the pixel array 110 of the image sensor 100 of FIG. 2. The embodiment of FIG. 10 may be considered in relation to the embodiment of FIG. 7, for example.

Referring to FIG. 13, the pixel array 110H may include a first normal pixel group NPG1H, a second normal pixel group NPG2H, the first AF pixel group APG1G, and the second AF pixel group APG2G. Each of the first normal pixel group NPG1H and the second normal pixel group NPG2H may include a normal pixel corresponding to the normal pixel NPX of FIG. 2, and each of the first AF pixel group APG and the second AF pixel group APG2G may include an AF pixel corresponding to the AF pixel AFPX of FIG. 2.

In some embodiments, each of the first normal pixel group NPG1H and the second normal pixel group NPG2H may have a quadrangular (e.g., a rectangular or a square) shape. Each of the first normal pixel group NPG1H and the second normal pixel group NPG2H may include one normal pixel including one photodiode NPDH and one microlens MLNH disposed on one photodiode NPDH.

The first normal pixel group NPG1H and the first AF pixel group APG1G may be disposed adjacent to each other in the first direction, and the second AF pixel group APG2G and the second normal pixel group NPG2H may be disposed adjacent to each other in the first direction. In addition, the second AF pixel group APG2G and the first normal pixel group NPG1H may be disposed adjacent to each other in the second direction, and the second normal pixel group NPG2H and the first AF pixel group APG1G may be disposed adjacent to each other in the second direction.

In some embodiments, the size of the first AF pixel group APG1G may be greater than a size of the first normal pixel group NPG1H, and the size of the second AF pixel group APG2G may be greater than a size of the second normal pixel group NPG2H. Also, in some embodiments, the size of the second AF pixel group APG2G may be greater than a size of the first normal pixel group NPG1H, and the size of the first AF pixel group APG1G may be greater than a size of the second normal pixel group NPG2H. For example, the first length of the first AF pixel group APG in the first direction may be greater than a first length of the first normal pixel group NPG1H in the first direction, and the first length of the second AF pixel group APG2G in the first direction may be greater than a first length of the second normal pixel group NPG2H in the first direction. Also, for example, the second length of the first AF pixel group APG1G in the second direction may be equal to the second length of the first normal pixel group NPG1H in the second direction, and the second length of the second AF pixel group APG2G in the second direction may be equal to the second length of the second normal pixel group NPG2H in the second direction. However, unlike shown in FIG. 13, for example, the second length of the first AF pixel group APG in the second direction may be greater than the second length of the first normal pixel group NPG1H in the second direction, and the second length of the second AF pixel group APG2G in the second direction may be greater than the second length of the second normal pixel group NPG2H in the second direction.

In some embodiments, a normal pixel of the first normal pixel group NPG1H may include the red color filter RF, and a normal pixel of the second normal pixel group NPG2H may include the blue color filter BF. However, the pixel array 110H is not limited thereto.

Figure 14:
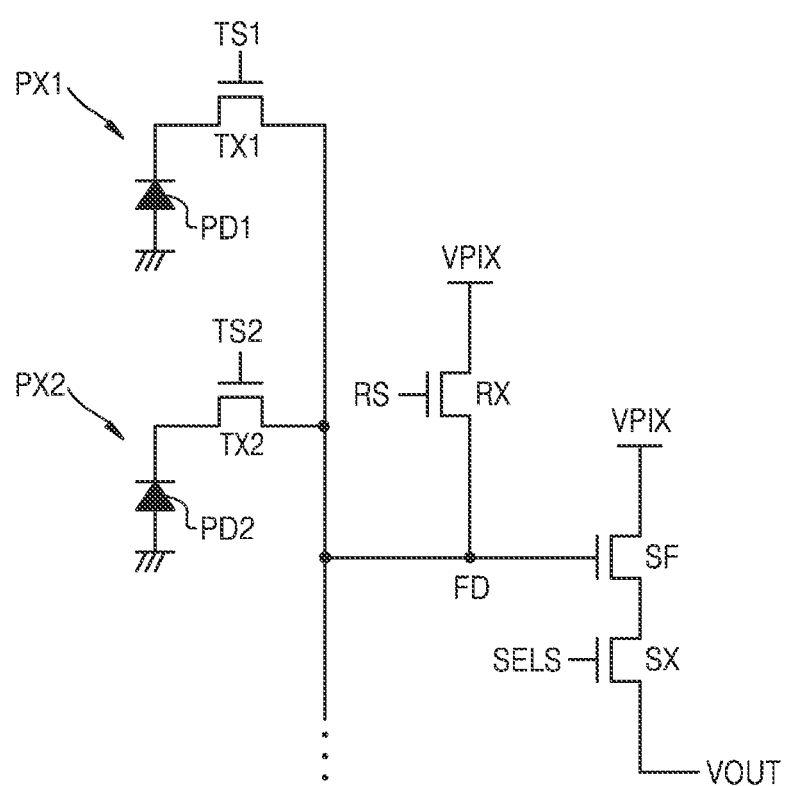
FIG. 14 is a circuit diagram illustrating pixels sharing a floating diffusion region.

FIG. 14 is a circuit diagram illustrating pixels sharing the floating diffusion region FD. Although only two pixels (e.g., the first pixel PX1 and the second pixel PX2) are illustrated in FIG. 14, three or more pixels may share the floating diffusion region FD, and the following descriptions will be applied accordingly. Alternately, each of the pixels included in a pixel array according to the inventive concept may include the floating diffusion regions FD distinguished from each other.

Referring to FIG. 14, the first pixel PX1 may include a first photodiode PD1, a first transfer transistor TX1, a selection transistor SX, a drive transistor SF, and a reset transistor RX. The second pixel PX2 may include a second photodiode PD2, a second transfer transistor TX2, the selection transistor SX, the drive transistor SF, and the reset transistor RX. The first pixel PX1 and the second pixel PX2 may share the floating diffusion region FD and may form a share pixel structure that shares the selection transistor SX, the drive transistor SF, and the reset transistor RX. In some embodiments, at least one of the selection transistor SX, the drive transistor SF, and the reset transistor RX may be omitted.

Each of the first photodiode PD1 and the second photodiode PD2 may generate photo-charge that vary according to the intensity of light. For example, each of the first photodiode PD1 and the second photodiode PD2 which is a P-N junction diode may generate a charge, that is, an electron (a negative charge) and a hole (a positive charge), in proportion to an amount of an incident light. Each of the first photodiode PD1 and the second photodiode PD2 may include at least one of a phototransistor, a photogate, a pinned photo diode (PPD) and combinations thereof as an example of a photoelectric conversion element.

The floating diffusion region FD may operate as a capacitor. The first transfer transistor TX1 may transmit photo-charge generated by the first photodiode PD1 to the floating diffusion region FD according to a first transfer control signal TS1. When the first transfer transistor TX1 is turned on, the photo-charge generated by the first photodiode PD1 may be transmitted to the floating diffusion region FD, and may be accumulated and stored in the floating diffusion region FD. The second transfer transistor TX2 may transmit photo-charge generated by the second photodiode PD2 to the floating diffusion region FD according to a second transfer control signal TS2.

The reset transistor RX may periodically reset the photo-charge accumulated in the floating diffusion region FD. A source electrode of the reset transistor RX may be connected to the floating diffusion region FD, and a drain electrode thereof may be connected to a power voltage VPIX. When the reset transistor RX is turned on according to a reset control signal RS, the power voltage VPIX connected to the drain electrode of the reset transistor RX may be transferred to the floating diffusion region FD. When the reset transistor RX is turned on, the photo-charge accumulated in the floating diffusion region DF may be discharged, and the floating diffusion region FD may be reset.

The drive transistor SF may be controlled according to an amount of the photo-charge accumulated in the floating diffusion region FD. The drive transistor SF which is a buffer amplifier may buffer a signal according to charges charged in the floating diffusion region FD. The drive transistor SF may amplify an electric potential change in the floating diffusion region FD and output the electric potential change as a pixel signal VOUT through a column output line (for example, one of the first column output line CLO_0 through the $n^{th}$ column output line CLO_n-1).

The selection transistor SX may have a drain terminal connected to a source terminal of the drive transistor SF, and may output the pixel signal VOUT to a CDS (for example, the CDS 151 in FIG. 2) through a column output line in response to a selection signal SELS.

Figure 15:
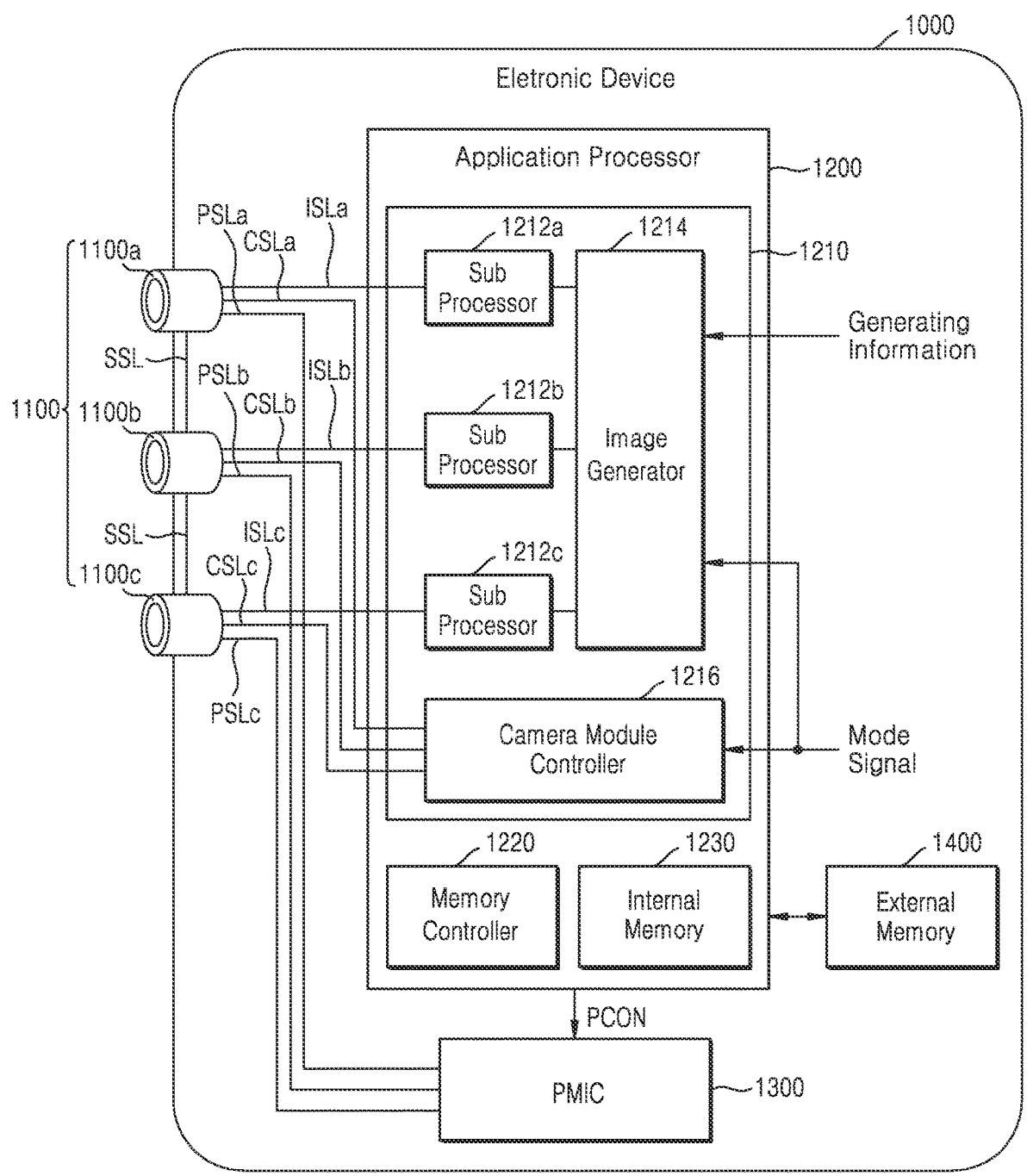
FIG. 15 is a block diagram illustrating an electronic device including a multi camera module.
Figure 16:
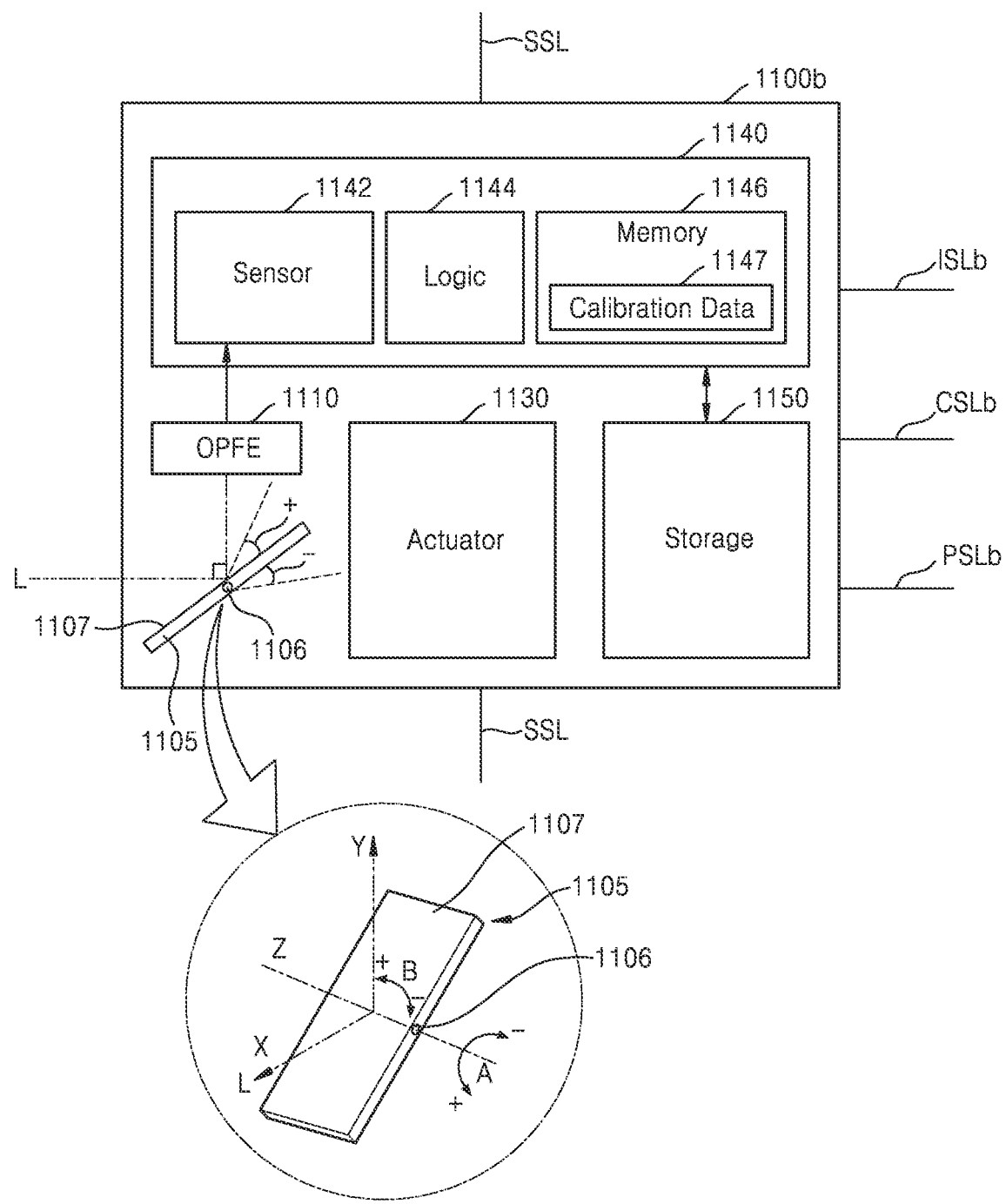
FIG. 16 is a block diagram further illustrating in one example the camera module 1100b of FIG. 15.

FIG. 15 is a block diagram illustrating an electronic device 1000 including a multi camera module according to embodiments of the inventive concept, and FIG. 16 is a block diagram further illustrating in one example a camera module (e.g., 1100*b*) of FIG. 15. However, the configuration of the camera module 1100*b* described in FIG. 16 may be applied to other camera modules 1100*a* and 1100*c*.

Referring to FIG. 15, the electronic device 1000 may include a camera module group 1100, an application processor 1200, a power management IC (PMIC) 1300, and an external memory 1400. The camera module group 1100 may include multiple camera modules (e.g., camera modules 1100*a*, 1100*b*, and 1100*c*). Although FIG. 15 shows an embodiment including three (3) camera modules 1100*a*, 1100*b*, and 1100*c*, the scope of the inventive concept is not limited thereto.

Referring to FIGS. 15 and 16, the camera module 1100*b* may include a prism 1105, an optical path folding element (hereinafter, referred to as "OPFE") 1110, an actuator 1130, an image sensing device 1140, and a storage 1150.

The prism 1105, which includes a reflecting plane 1107 formed of a light-reflecting material, may change a path of light L incident from outside. In some example embodiments, the prism 1105 may change a path of the light "L" incident in a first direction "X" to a second direction "Y" perpendicular to the first direction "X", Also, the prism 1105 may change the path of the light "L" incident in the first direction "X" to the second direction "Y" perpendicular to the first direction "X" by rotating the reflecting plane 1107 of the light reflecting material in direction "A" about a central axis 1106 or rotating the central axis 1106 in direction "B". In this case, the OPFE 1110 may move in a third direction "Z" perpendicular to the first direction "X" and the second direction "Y". The OPFE 1110 may include, for example, optical lenses constructed in m (wherein m is a natural number) groups. The actuator 1130 may shift the OPFE 1110 or the optical lenses (hereinafter, referred to as optical lenses) to a specific position.

The image sensing device 1140 may include an image sensor 1142, a control logic 1144, and a memory 1146. The image sensor 1142 may sense an image of a sensing object by using the light L provided through the optical lenses. The image sensor 1142 may be the image sensor 100 described with reference to FIG. 1, and may include the pixel arrays 110~110H described with reference to FIGS. 3 through 13.

The control logic 1144 may control all operations of the camera module 1100*b*. For example, the control logic 1144 may control operations of the camera module 1100*b* in response to a control signal provided through a control signal line CSLb. The memory 1146 may store information, which is necessary for an operation of the camera module 1100*b*, such as calibration data 1147.

In some embodiments, one camera module (e.g., the camera module 1100*b*) among the camera modules 1100*a*, 1100*b*, and 1100*c* may be a camera module having a folded lens shape, which includes the prism 1105 and the OPFE 1110 described above, while other camera modules (e.g., the camera modules 1100*a* and 1100*c*) may be camera modules having a vertical shape, in which the prism 1105 and the OPFE 1110 are not included, but the scope of the inventive concept is not limited thereto.

In some embodiments, one camera module (e.g., the camera module 1100*c*) among the camera modules 1100*a*, 1100*b*, and 1100*c* may include, for example, a depth camera having a vertical depth, which extracts depth information by using an infrared ray (IR). In this case, the application processor 1200 may generate a three-dimensional (3D) image depth by merging an image data value provided from the depth camera and an image data value provided from another camera module (e.g., the camera module 1100*a* or 1100*b*).

In some embodiments, at least two camera modules (e.g., the camera modules 1100*a* and 1100*b*) among the camera modules 1100*a*, 1100*b*, and 1100*c* may have different fields of view. In this case, optical lenses of the at least two camera modules (e.g., the camera modules 1100*a* and 1100*b*) among the camera modules 1100*a*, 1100*b*, and 1100*c* may be different from one another.

Furthermore, in some embodiments, fields of view for camera modules 1100*a*, 1100*b*, and 1100*c* may be different from one another. In this case, optical lenses respectively included in the camera modules 1100*a*, 1100*b*, and 1100*c* may be different from one another.

In some embodiments, the camera modules 1100*a*, 1100*b*, and 1100*c* may be physically separated from one another. That is, a sensing area of one image sensor 1142 is not used in division by the camera modules 1100*a*, 1100*b*, and 1100*c*, and the image sensor 1142 may be individually arranged in each of the camera modules 1100*a*, 1100*b*, and 1100*c*.

Referring again to FIG. 15, the application processor 1200 may include an image processing device 1210, a memory controller 1220, and an internal memory 1230. The application processor 1200 may be implemented in separation from the camera modules 1100*a*, 1100*b*, and 1100*c*. For example, the application processor 1200 and the camera modules 1100*a*, 1100*b*, and 1100*c* may be implemented in separation from each other as separate semiconductor chips.

The image processing device 1210 may include multiple sub image processors 1212*a*, 1212*b*, and 1212*c*, an image generator 1214, and a camera module controller 1216.

The image processing device 1210 may include the sub image processors 1212*a*, 1212*b*, and 1212*c* in a number corresponding to the number of the camera modules 1100*a*, 1100*b*, and 1100*c*.

Image data values respectively generated by the camera modules 1100*a*, 1100*b*, and 1100*c* may be provided to corresponding sub image processors 1212*a*, 1212*b*, and 1212*c* through image signal lines ISLa, ISLb, and ISLc that are separated from one another. For example, the image data value provided by the camera module 1100*a* may be provided to the sub image processor 1212*a* through the image signal line ISLa, the image data value provided by the camera module 1100*b* may be provided to the sub image processor 1212*b* through the image signal line ISLb, and the image data value provided by the camera module 1100*c* may be provided to the sub image processor 1212*c* through the image signal line ISLc. Transmission of the image data values may be performed, for example, by using a mobile industry processor interface (MIPI)-based camera serial interface (CSI), but the inventive concept is not limited thereto.

The image data values provided to the sub image processors 1212*a*, 1212*b*, and 1212*c* may be provided to the image generator 1214. The image generator 1214 may generate an output image by using image data provided by each of the sub image processors 1212*a*, 1212*b*, and 1212*c* according to image generating information or a mode signal.

In detail, the image generator 1214 may generate the output image by merging at least some of the image data values, which are generated from the camera modules 1100a, 1100b, and 1100c having different fields of view, according to the image generating information or the mode signal. In addition, the image generator 1214 may generate the output image by selecting any one of the image data values, which are generated from the camera modules 1100a, 1100b, and 1100c having different fields of view, according to the image generating information or the mode signal.

The camera module controller 1216 may provide a control signal to each of the camera module 1100a, 1100b, and 1100c. The control signals generated by the camera module controller 1216 may be provided to corresponding camera modules 1100a, 1100b, and 1100c through the control signal lines CSLa, CSLb, and CSLc that are separated from one another.

The application processor 1200 may store the received image data values (i.e., encoded data) in the internal memory 1230 or the external memory 1400 outside the application processor 1200, and then, may read and decode the encoded data from the internal memory 1230 or the the external memory 1400 and display an image that is generated based on the decoded image values. For example, corresponding sub image processors among the sub image processors 1212a, 1212b, and 1212c of the image processing device 1210 may perform decoding, and may also perform decoding with respect to the decoded image values.

The PMIC 1300 may provide power (e.g., the power voltage) to each of the camera modules 1100a, 1100b, and 1100c. For example, under control of the application processor 1200, the PMIC 1300 may provide a first power to the camera module 1100a through the power signal line PSLa, provide a second power to the camera module 1100b through the power signal line PSLb, and provide a third power to the camera module 1100c through the power signal line PSLc.

While the inventive concept has been particularly shown and described with reference to certain illustrated embodiments, it will be understood that various changes in form and details may be made therein without departing from the scope of the inventive concept, as defined by the following claims.

What is claimed is:

1. An image sensor, comprising:
a pixel array including pixels arranged in a first direction and a second direction, wherein the pixels includes a first normal pixel and a first auto focus (AF) pixel adjacent in the first direction, and a second AF pixel and a second normal pixel adjacent in the first direction,
wherein each of the first AF pixel and the second AF pixel includes at least two photodiodes,
each of the first normal pixel and the second normal pixel has a quadrangular shape,
a first length of the first AF pixel in the first direction is greater than a first length of the first normal pixel in the first direction,
a first length of the second AF pixel in the first direction is greater than a first length of the second normal pixel in the first direction,
each of the first AF pixel and the second AF pixel has an octagonal shape,
a second length of the first AF pixel in the second direction is greater than a second length of the first normal pixel in the second direction, and a second length of the second AF pixel in the second direction is greater than a second length of the second normal pixel in the second direction.

2. The image sensor of claim 1, wherein each of the first AF pixel and the second AF pixel includes a green color filter.

3. The image sensor of claim 1, wherein each of the first AF pixel and the second AF pixel includes a yellow color filter.

4. The image sensor of claim 1, wherein the at least two photodiodes include a first photodiode and a second photodiode adjacent in the first direction, and the image sensor further includes a microlens on the first photodiode and the second photodiode.

5. The image sensor of claim 1, wherein the at least two photodiodes include a first photodiode, a second photodiode, a third photodiode and a fourth photodiode commonly adjacent to one another in the first direction and in the second direction, and the image sensor further includes a microlens on the first photodiode, the second photodiode, the third photodiode and the fourth photodiode.

6. An image sensor comprising:
a pixel array including a first normal pixel group, a second normal pixel group, a first AF pixel group, and a second AF pixel group,
wherein each of the first normal pixel group and the second normal pixel group includes at least one normal pixel having a same color filter,
each of the first AF pixel group and the second AF pixel group includes AF pixels having a same color filter,
the first normal pixel group and the first AF pixel group are adjacent in a first direction,
the second AF pixel group and the second normal pixel group are adjacent in the first direction,
each of the AF pixels includes at least two photodiodes,
a first length of the first AF pixel group in the first direction is greater than a first length of the first normal pixel group in the first direction,
a first length of the second AF pixel group in the first direction is greater than a first length of the second normal pixel group in the first direction,
each of the first AF pixel group and the second AF pixel group has an octagonal shape,
a second length of the first AF pixel group in a second direction intersect with the first direction is greater than a second length of the first normal pixel group in the second direction, and
a second length of the second AF pixel group in the second direction is greater than a second length of the second normal pixel group in the second direction.

7. The image sensor of claim 6, wherein each of the first AF pixel group and the second AF pixel group includes at least one of a green color filter and a white color filter.

8. The image sensor of claim 6, wherein each of the first AF pixel group and the second AF pixel group includes AF pixels, and
each of the AF pixels includes a first photodiode, a second photodiode, and a microlens on the first photodiode and the second photodiode.

9. The image sensor of claim 6, wherein each of the first AF pixel group and the second AF pixel group includes AF pixels, and
each of the AF pixels includes a first photodiode, a second photodiode, a third photodiode, a fourth photodiode, and a microlens on the first photodiode, the second photodiode, the third photodiode and the fourth photodiode.

10. The image sensor of claim 6, wherein each of the first normal pixel group and the second normal pixel group includes normal pixels, and
 each of normal pixels includes one photodiode and one microlens on the one photodiode.

11. The image sensor of claim 6, wherein each of the first normal pixel group and the second normal pixel group comprises one normal pixel, and
 the normal pixel includes one photodiode and one microlens on the one photodiode.

12. An image sensor comprising:
 a pixel array including pixels arranged in a first direction and a second direction, wherein the pixels include a first normal pixel, a second normal pixel, a first AF pixel and a second AF pixel,
 wherein each of the first normal pixel and the second normal pixel includes a single photodiode and a microlens,
 each of the first AF pixel and the second AF pixel includes at least two photodiodes and a microlens,
 the first normal pixel and the first AF pixel are adjacent in the first direction,
 the second AF pixel and the second normal pixel are adjacent in the first direction,
 the first normal pixel and the second AF pixels are adjacent in the second direction,
 a size of the first AF pixel is greater than a size of the first normal pixel,
 a size of the second AF pixel is greater than a size of the second normal pixel,
 each of the first AF pixel and the second AF pixel has an octagonal shape,
 a second length of the first AF pixel in the second direction is greater than a second length of the first normal pixel in the second direction, and
 a second length of the second AF pixel in the second direction is greater than a second length of the second normal pixel in the second direction.

13. The image sensor of claim 12, wherein each of the first AF pixel and the second AF pixel includes one of a green color filter and a white color filter.

14. he image sensor of claim 12, wherein each of the first AF pixel and the second AF pixel includes two photodiodes.

15. The image sensor of claim 12, wherein each of the first AF pixel and the second AF pixel includes four photodiodes.

* * * * *